(12) United States Patent
Qing

(10) Patent No.: US 12,315,442 B2
(45) Date of Patent: *May 27, 2025

(54) DISPLAY DEVICE AND DRIVING METHOD THEREFOR

(71) Applicants: Chengdu BOE Optoelectronics Technology Co., Ltd., Sichuan (CN); BOE Technology Group Co., Ltd., Beijing (CN)

(72) Inventor: Haigang Qing, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 166 days.

This patent is subject to a terminal disclaimer.

(21) Appl. No.: 17/770,613

(22) PCT Filed: Jun. 9, 2021

(86) PCT No.: PCT/CN2021/099158
§ 371 (c)(1),
(2) Date: Apr. 20, 2022

(87) PCT Pub. No.: WO2022/017042
PCT Pub. Date: Jan. 27, 2022

(65) Prior Publication Data
US 2023/0026444 A1    Jan. 26, 2023

(30) Foreign Application Priority Data
Jul. 21, 2020    (CN) .......................... 202010705965.6

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01); *G09G 2300/0842* (2013.01); *G09G 2320/0233* (2013.01); *G09G 2330/021* (2013.01)

(58) Field of Classification Search
None
See application file for complete search history.

(56) References Cited

U.S. PATENT DOCUMENTS

2021/0327361 A1* 10/2021 Park ................... G09G 3/3266

* cited by examiner

*Primary Examiner* — Andre L Matthews
(74) *Attorney, Agent, or Firm* — Ling Wu; Stephen Yang; Ling and Yang Intellectual Property

(57) ABSTRACT

A display device includes light emitting elements arranged in a matrix and pixel circuits arranged in a matrix. A pixel circuit includes a first reset sub-circuit, a node control sub-circuit, a light emitting control sub-circuit and a second reset sub-circuit. The first reset sub-circuit is configured to provide a signal of an initial signal line to a first node. The node control sub-circuit is configured to provide a signal of a data signal line to a second node, and compensate the first node until a voltage of the first node meets a threshold condition. The light emitting control sub-circuit is configured to provide a signal of a first power supply line to the second node and provide a signal of a third node to a light emitting element. The second reset sub-circuit is configured to provide a signal of the initial signal line to the light emitting element.

19 Claims, 21 Drawing Sheets

DISPLAY DEVICE AND DRIVING METHOD THEREFOR

CROSS-REFERENCE TO RELATED APPLICATIONS

The present application is a U.S. National Phase Entry of International Application No. PCT/CN2021/099158 having an international filing date of Jun. 9, 2021, which claims priority to Chinese Patent Application No. 202010705965.6, filed to the CNIPA on Jul. 21, 2020. The entire contents of the above-identified applications are hereby incorporated by reference.

TECHNICAL FIELD

The present disclosure relates to the technical field of display technology, in particular to a display device and a driving method thereof.

BACKGROUND

The Organic Light Emitting Diode (OLED for short) is one of hotspots in the field of display research today. Compared with the Liquid Crystal Display (LCD for short), the OLED has the advantages such as low energy consumption, low production cost, self-illumination, wide viewing angle and fast response speed, and has been widely used in the field of display such as mobile phones, tablet computers and digital cameras.

Unlike the LCD which uses a stable voltage to control brightness, the OLED adopts current driving, and controls light emission of the OLED by a stable current. A pixel circuit, as a core technology of an OLED display product, is configured to output to a driving circuit of the OLED to drive the OLED to emit light.

SUMMARY

The following is a summary of the subject matter described in detail in the present application. The summary is not intended to limit the scope of protection of claims.

In a first aspect, the present disclosure provides a display device, including: light emitting elements arranged in a matrix, pixel circuits arranged in a matrix, a scanning signal line, a data signal line, an initial signal line, a light emitting control line, a first power supply line, a first reset line, a second reset line, and a third reset line; wherein the pixel circuits are in one-to-one correspondence with the light emitting elements; a pixel circuit is configured to drive a corresponding light emitting element to emit light, and the pixel circuit includes a first reset sub-circuit, a node control sub-circuit, a light emitting control sub-circuit and a second reset sub-circuit; the first reset sub-circuit is connected respectively with the first reset line, the initial signal line, and a first node, and is configured to provide a signal of the initial signal line to the first node under control of the first reset line; the node control sub-circuit is connected respectively with the scanning signal line, the second reset line, the data signal line, the first node, a second node, a third node and the first power supply line, and is configured to, under control of the scanning signal line, the second reset line and the first node, provide a signal of the data signal line to the second node, and compensate the first node through the second node and the third node until a voltage of the first node meets a threshold condition, and to provide a signal of the second node to the third node under control of the first node; the light emitting control sub-circuit is connected respectively with the light emitting control line, the first power supply line, the second node, the third node and a light emitting element, and is configured to, under control of the light emitting control line, provide a signal of the first power supply line to the second node and provide a signal of the third node to the light emitting element; and the second reset sub-circuit is connected respectively with the third reset line, the initial signal line and the light emitting element, and is configured to provide a signal of the initial signal line to the light emitting element under control of the third reset line; wherein a third reset line connected with a pixel circuit located in an $i^{th}$ row is electrically connected with a first reset line connected with a pixel circuit located in an $(i+1)^{th}$ row, $1 \leq i < M$, where M is a total number of rows of the pixel circuits.

In some possible implementations, the display device includes: a substrate and a driving structure layer and a light emitting structure layer sequentially disposed on the substrate; the driving structure layer includes the pixel circuits, the scanning signal line, the data signal line, the initial signal line, the light emitting control line, the first power supply line, the first reset line, the second reset line and the third reset line, and the light emitting structure layer includes the light emitting elements; the scanning signal line, the initial signal line, the light emitting control line, the first reset line, the second reset line, and the third reset line extend along a first direction, the data signal line and the first power supply line extend along a second direction; the first direction intersects with the second direction.

In some possible implementations, each pixel circuit includes a storage capacitor including a first plate and a second plate; the first plate is connected with the first power supply line, and the second plate is connected with the first node; an orthographic projection of the first plate on the substrate is partially overlapped with an orthographic projection of the second plate on the substrate; the first plate is provided with a via, and the via of the first plate exposes the second plate; the scanning signal line, the first reset line and the second reset line are located at one side of the second plate, and the light emitting control line and the third reset line are located at one side of the second plate away from the first reset line; the first reset line is located at one side of the scanning signal line away from the second plate, the second reset line is located at one side of the scanning signal line close to the second plate, and the third reset line is located at one side of the light emitting control line away from the second plate; the initial signal line includes a first initial signal line and a second initial signal line; the first initial signal line and the first reset line are located at a same side of the second plate, and the first initial signal line is located at one side of the first reset line away from the second plate; the second initial signal line and the third reset line are located at a same side of the second plate, and the second initial signal line is located at one side of the third reset line away from the second plate.

In some possible implementations, the driving structure layer further includes: a power supply connecting line and a connecting electrode; the power supply connecting line is disposed in a different layer from the first power supply line and is connected with the first power supply line, and the first plate is connected with the first power supply line by the power supply connecting line; an orthographic projection of the power supply connecting line on the substrate is at least partially overlapped with the orthographic projection of the first plate on the substrate and at least partially overlapped with an orthographic projection of the first power supply line on the substrate; the connecting electrode is configured to connect the pixel circuit with the light emitting element.

In some possible implementations, the node control sub-circuit includes: a writing sub-circuit, a driving sub-circuit, a compensation sub-circuit, and an energy storage sub-circuit; the writing sub-circuit is connected respectively with the scanning signal line, the second reset line, the data signal line and the second node, and is configured to provide a signal of the data signal line to the second node under control of the scanning signal line and the second reset line, or to discharge to the second node; the driving sub-circuit is connected respectively with the first node, the second node, and the third node, and is configured to provide a signal of the second node to the third node under control of the first node; the compensation sub-circuit is connected respectively with the first node, the second reset line and the third node, and is configured to provide a potential of the third node to the first node under control of the second reset line to compensate the first node until the voltage of the first node meets the threshold condition; the energy storage sub-circuit is connected respectively with the first power supply line and the first node, and is configured to store a voltage difference between the first power supply line and the first node.

In some possible implementations, the first reset sub-circuit includes a first transistor; a control electrode of the first transistor is connected with the first reset line, a first electrode of the first transistor is connected with the initial signal line, and a second electrode of the first transistor is connected with the first node.

In some possible implementations, the writing sub-circuit includes a second transistor and a third transistor; a control electrode of the second transistor is connected with the scanning signal line, a first electrode of the second transistor is connected with the data signal line, and a second electrode of the second transistor is connected with a first electrode of the third transistor; a control electrode of the third transistor is connected with the second reset line, and a second electrode of the third transistor is connected with the second node; a length of a conductive channel of the third transistor is greater than a threshold length, and a width of the conductive channel of the third transistor is greater than a threshold width.

In some possible implementations, the driver sub-circuit includes a fourth transistor, and the fourth transistor is a driving transistor; the energy storage sub-circuit includes a storage capacitor; a control electrode of the fourth transistor is connected with the first node, a first electrode of the fourth transistor is connected with the second node, and a second electrode of the fourth transistor is connected with the third node; a first terminal of the storage capacitor is connected with the first power supply line, and a second terminal of the storage capacitor is connected with the first node.

In some possible implementations, the compensation sub-circuit includes a fifth transistor; a control electrode of the fifth transistor is connected with the second reset line, a first electrode of the fifth transistor is connected with the first node, and a second electrode of the fifth transistor is connected with the third node.

In some possible implementations, the light emitting control sub-circuit includes a sixth transistor and a seventh transistor; a control electrode of the sixth transistor is connected with the light emitting control line, a first electrode of the sixth transistor is connected with the first power supply line, and a second electrode of the sixth transistor is connected with the second node; a control electrode of the seventh transistor is connected with the light emitting control line, a first electrode of the seventh transistor is connected with the third node, and a second electrode of the seventh transistor is connected with the light emitting element.

In some possible implementations, the second reset sub-circuit includes an eighth transistor; a control electrode of the eighth transistor is connected with the third reset line, a first electrode of the eighth transistor is connected with the initial signal line, and a second electrode of the eighth transistor is connected with the light emitting element.

In some possible implementations, the first reset sub-circuit includes a first transistor; the node control sub-circuit includes a second transistor, a third transistor, a fourth transistor, a fifth transistor and a storage capacitor, wherein the fourth transistor is a driving transistor; the light emitting control sub-circuit includes a sixth transistor and a seventh transistor; and the second reset sub-circuit includes an eighth transistor; a control electrode of the first transistor is connected with the first reset line, a first electrode of the first transistor is connected with the initial signal line, and a second electrode of the first transistor is connected with the first node; a control electrode of the second transistor is connected with the scanning signal line, a first electrode of the second transistor is connected with the data signal line, and a second electrode of the second transistor is connected with a first electrode of the third transistor; a control electrode of the third transistor is connected with the second reset line, and a second electrode of the third transistor is connected with the second node; a control electrode of the fourth transistor is connected with the first node, a first electrode of the fourth transistor is connected with the second node, and a second electrode of the fourth transistor is connected with the third node; a control electrode of the fifth transistor is connected with the second reset line, a first electrode of the fifth transistor is connected with the first node, and a second electrode of the fifth transistor is connected with the third node; a first terminal of the storage capacitor is connected with the first power supply line, and a second terminal of the storage capacitor is connected with the first node; a control electrode of the sixth transistor is connected with the light emitting control line, a first electrode of the sixth transistor is connected with the first power supply line, and a second electrode of the sixth transistor is connected with the second node; a control electrode of the seventh transistor is connected with the light emitting control line, a first electrode of the seventh transistor is connected with the third node, and a second electrode of the seventh transistor is connected with the light emitting element; a control electrode of the eighth transistor is connected with the third reset line, a first electrode of the eighth transistor is connected with the initial signal line, and a second electrode of the eighth transistor is connected with the light emitting element.

In some possible implementations, the light emitting element includes an organic light emitting diode; an anode of the organic light emitting diode is connected respectively with the second electrode of the seventh transistor and the second electrode of the eighth transistor, and a cathode of the organic light emitting diode is connected with a second power supply line.

In some possible implementations, the threshold condition is that the voltage of the first node is equal to a difference between a voltage of the signal of the data signal line and an absolute value of a threshold voltage of the fourth transistor.

In some possible implementations, the scanning signal line and the third reset line are electrically connected.

In some possible implementations, for the first transistor to the eighth transistor, each transistor includes an active layer, a control electrode, a first electrode, and a second electrode; the driving structure layer includes an active layer, a first insulating layer, a first metal layer, a second insulating layer, a second metal layer, a third insulating layer, a third metal layer, a fourth insulating layer, a first planarization layer, a fourth metal layer and a second planarization layer that are sequentially disposed along a direction perpendicular to the substrate; the active layer includes the initial signal line and the active layers of all transistors; the first metal layer includes the scanning signal line, the first reset line, the second reset line, the second plate, the light emitting control line, the third reset line and the control electrodes of all transistors; the second metal layer includes the first plate; the third metal layer includes the power supply connecting line and a first electrode or a second electrode of a part of the transistors; the fourth metal layer includes the first power supply line, the data signal line and the pixel electrode.

In some possible implementations, the control electrode of the first transistor includes a first sub-control electrode and a second sub-control electrode disposed in a same layer.

In some possible implementations, the first insulating layer, the second insulating layer, and the third insulating layer are provided with a first via, a second via, a third via, a fourth via, and a fifth via; the second insulating layer and the third insulating layer are provided with a sixth via; the third insulating layer is provided with a seventh via; the fourth insulating layer and the first planarization layer are provided with an eighth via, a ninth via and a tenth via; the second planarization layer includes an eleventh via; the first via exposes the active layer of the first transistor, and the second electrode of the first transistor is connected with the active layer of the first transistor through the first via; the second via exposes the active layer of the second transistor, and the first electrode of the second transistor is connected with the active layer of the second transistor through the second via; the third via exposes the active layer of the fifth transistor, and the first electrode of the fifth transistor is connected with the active layer of the fifth transistor through the third via; the fourth via exposes the active layer of the seventh transistor, and the second electrode of the seventh transistor is connected with the active layer of the seventh transistor through the fourth via; the fifth via exposes the active layer of the sixth transistor, and the first electrode of the sixth transistor is connected with the active layer of the sixth transistor through the fifth via; the sixth via exposes the second plate, and the first electrode of the fifth transistor is connected with the second plate through the sixth via; the seventh via exposes the first plate, and the power supply connecting line is connected with the first plate through the seventh via; the eighth via exposes the first electrode of the second transistor, and the data signal line is connected with the first electrode of the second transistor through the eighth via; the ninth via exposes the power supply connecting line, and the first power supply line is connected with the power supply connecting line through the ninth via; the tenth via exposes the second electrode of the seventh transistor, and the connecting electrode is connected with the second electrode of the seventh transistor through the tenth via; the eleventh via exposes the connecting electrode, and the light emitting element is connected with the connecting electrode through the eleventh via.

In some possible implementations, the light emitting element includes a first electrode, a second electrode, and an organic light emitting layer; the first electrode is located on one side of the organic light emitting layer close to the substrate, and the second electrode is located on one side of the organic light emitting layer away from the substrate; the light emitting structure layer includes a pixel definition layer, a transparent conductive layer, an organic material layer and a conductive layer, wherein the transparent conductive layer includes the first electrode, the organic material layer includes the organic light emitting layer, and the conductive layer includes the second electrode.

In a second aspect, the present disclosure also provides a driving method of a display device, for driving the display device as described above, the method including: providing, by the first reset sub-circuit, a signal of the initial signal line to the first node under control of the first reset line; providing, by the second reset sub-circuit, a signal of the initial signal line to the light emitting element under control of the third reset line, and providing, by the node control sub-circuit, a signal of the data signal line to the second node, and compensating the first node through the second node and the third node until the voltage of the first node meets the threshold condition, under control of the scanning signal line, the second reset line and the first node; and providing, by the light emitting control sub-circuit, a signal of the first power supply line to the second node, and a signal of the third node to the light emitting element, under control of the light emitting control line; and providing, by the node control sub-circuit, a signal of the second node to the third node under control of the first node.

Other aspects can be understood upon reading and understanding of the accompanying drawings and the detailed description.

BRIEF DESCRIPTION OF DRAWINGS

Accompany drawings are used to provide understanding of technical solutions of the present disclosure, form a part of the specification, and together with embodiments of the present disclosure, are used to explain the technical solutions of the present disclosure, but do not form limitations on the technical solutions of the present disclosure.

DETAILED DESCRIPTION

Figure 1:
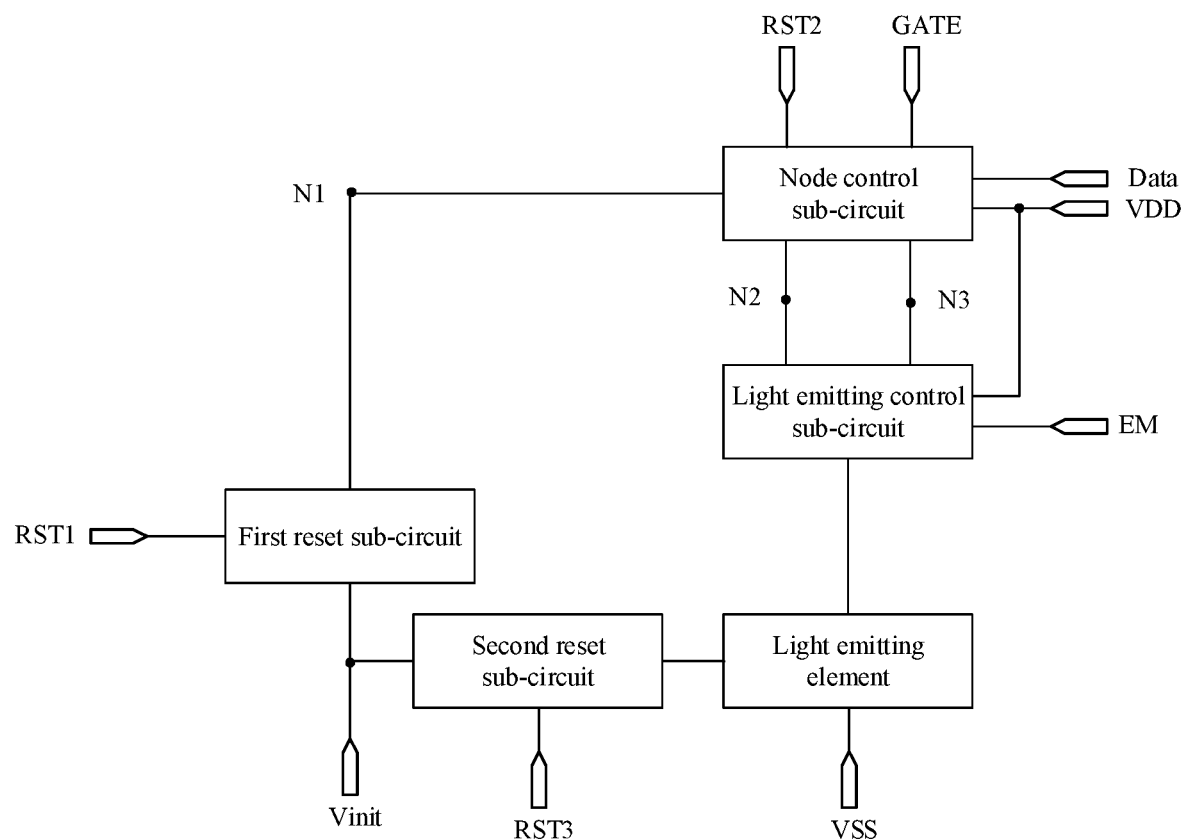
FIG. 1 is a schematic diagram of a structure of a pixel circuit provided by an embodiment of the present disclosure.

Embodiments of the present application will be described below in detail in conjunction with the accompanying drawings. The embodiments in the present application and features in the embodiments can be combined with each other arbitrarily if there is no conflict.

The present disclosure describes multiple embodiments, but the description is exemplary rather than restrictive. For those of ordinary skill in the art, there may be more embodiments and implementations in the scope of the embodiments described in the present disclosure. Although many possible combinations of features are shown in the drawings and discussed in the detailed description, many other combinations of the disclosed features are also possible. Unless expressly limited, any feature or element of any embodiment may be used in combination with, or may replace, any other feature or element in any other embodiment.

The present disclosure includes and conceives combinations with the features and elements known to those of ordinary skills in the art. The embodiments, features and elements that have been disclosed in the present disclosure may also be combined with any conventional features or elements to form technical solutions defined by the claims. Any features or elements of any embodiment may also be combined with features or elements from other technical solutions to form another technical solution defined by the claims. Therefore, it should be understood that any of the features shown and/or discussed in the present disclosure may be embodied alone or in any suitable combination. Therefore, the embodiments are not to be limited except the limitation by the appended claims and equivalents thereof. Furthermore, various modifications and variations may be made within the scope of the appended claims.

Unless otherwise defined, the technical or scientific terms used in the present disclosure shall have the ordinary meanings understood by those of ordinary skill in the art to which the present disclosure pertains. The "first", "second" and similar terms used in the present disclosure do not indicate any order, number, or importance, but are used only for distinguishing different components. Terms such as "Comprise" or "include" mean that an element or object appearing before the term includes the elements or objects listed after the term and their equivalents and does not exclude other components or objects. Terms such as "connect" or "join" are not limited to physical or mechanical connection, but may include electrical connection, whether direct or indirect. Terms such as "up", "down", "left" or "right" are only used to indicate relative positional relationship, and when an absolute position of a described object is changed, the relative positional relationship may also change correspondingly.

A transistor is an element that includes at least three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. In the specification, the channel region refers to a region that the current mainly flows through. A first electrode may be a drain electrode and a second electrode may be a source electrode, or the first electrode may be a source electrode and the second electrode may be a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" may be exchanged in the specification. In addition, there are two types of transistors: P-type transistor and N-type transistor, wherein the P-type transistor is turned on when its gate electrode is at a low level and turned off when its gate electrode is at a high level, and the N-type transistor is turned on when its gate electrode is at a high level and turned off when its gate electrode is at a low level.

With the maturity of the OLED display technology, people's demand for high frequency OLED display products is becoming more and more urgent. For high frequency OLED display products, a pixel circuit includes a driving transistor and a storage capacitor. Since the time when a scanning signal in the pixel circuit keeps at an effective level is short, the charge stored in the storage capacitor is insufficient, and the threshold voltage compensation for the driving transistor is insufficient, so that the display of an OLED display product is uneven and the display effect of the OLED display product is reduced.

FIG. 1 is a schematic diagram of a structure of a pixel circuit provided by an embodiment of the present disclosure. As shown in FIG. 1, the pixel circuit provided by the embodiment of the present disclosure is configured to drive a light emitting element to emit light, the pixel circuit includes: a first reset sub-circuit, a node control sub-circuit, a light emitting control sub-circuit and a second reset sub-circuit.

The first reset sub-circuit is connected respectively with a first reset line RST1, an initial signal line Vinit and a first node N1, and is configured to provide a signal of the initial signal line Vinit to the first node N1 under control of the first reset line RST1. The node control sub-circuit is connected respectively with a scanning signal line Gate, a second reset line RST2, a data signal line Data, the first node N1, a second node N2, a third node N3 and a first power supply line VDD, and is configured to, under control of the scanning signal line Gate, the second reset line RST2 and the first node N1, provide a signal of the data signal line Data to the second node N2, and compensate the first node N1 through the second node N2 and the third node N3 until the voltage of the first node N1 meets a threshold condition, and to provide a signal of the second node N2 to the third node N3 under control of the first node N1. The light emitting control sub-circuit is connected respectively with a light emitting control line EM, the first power supply line VDD, the second node N2, the third node N3 and a light emitting element, and is configured to provide a signal of the first power supply line VDD to the second node N2 and provide a signal of the third node N3 to the light emitting element, under control of the light emitting control line EM. The second reset sub-circuit is connected respectively with a third reset line RST3, the initial signal line Vinit and the light emitting element, and is configured to provide the signal of the initial signal line Vinit to the light emitting element under control of the third reset line RST3. The light emitting element is connected with a second power supply line VSS.

In an exemplary embodiment, the signals of the first reset line RST1, the second reset line RST2, the third reset line RST3, the scanning signal line Gate, and the light emitting control line EM may be pulse signals.

In an exemplary embodiment, the first power supply line VDD may continuously provide a high level signal. The second power supply line VSS and the initial signal line Vinit may continuously provide low level signals.

In an exemplary embodiment, the signal of the initial signal line Vinit may be a signal of which a voltage value is 0V.

In an exemplary embodiment, a voltage value of the signal of the second power supply line VSS and a voltage value of the signal of the initial signal line Vinit may be equal or unequal.

In an exemplary embodiment, the signal of the initial signal line Vinit may reset the light emitting element and the first node.

In an exemplary embodiment, the light emitting element may be an organic light emitting diode (OLED). An anode of the organic light emitting diode (OLED) is connected with the light emitting control sub-circuit, and a cathode of the organic light emitting diode (OLED) is connected with the second power supply line VSS.

The pixel circuit provided by the embodiment of the present disclosure is configured to drive a light emitting element to emit light, the pixel circuit includes: a first reset sub-circuit, a node control sub-circuit, a light emitting control sub-circuit and a second reset sub-circuit. The first reset sub-circuit is connected respectively with a first reset line, an initial signal line, and a first node, and is configured to provide a signal of the initial signal line to the first node under control of the first reset line. The node control sub-circuit is connected respectively with a scanning signal line, a second reset line, a data signal line, the first node, a second node, a third node and a first power supply line, and is configured to, under control of the scanning signal line, the second reset line and the first node, provide a signal of the data signal line to the second node, and compensate the first node through the second node and the third node until the voltage of the first node meets a threshold condition, and to provide a signal of the second node to the third node under control of the first node. The light emitting control sub-circuit is connected respectively with a light emitting control line, the first power supply line, the second node, the third node and a light emitting element, and is configured to provide a signal of the first power supply line to the second node and provide a signal of the third node to the light emitting element, under control of the light emitting control line. The second reset sub-circuit is connected respectively with a third reset line, the initial signal line and the light emitting element, and is configured to provide a signal of the initial signal line to the light emitting element under control of the third reset line. The light emitting element is connected with a second power supply line. The node control sub-circuit in the present disclosure simultaneously controls the compensation for the first node through the scanning signal line and the second reset line. Therefore, after a signal of a data signal terminal is written and before the light emitting element emits light, the first node can be continuously compensated until the first node meets the threshold condition, thereby enhancing the compensation effect and improving the display effect of the display product.

Figure 2:
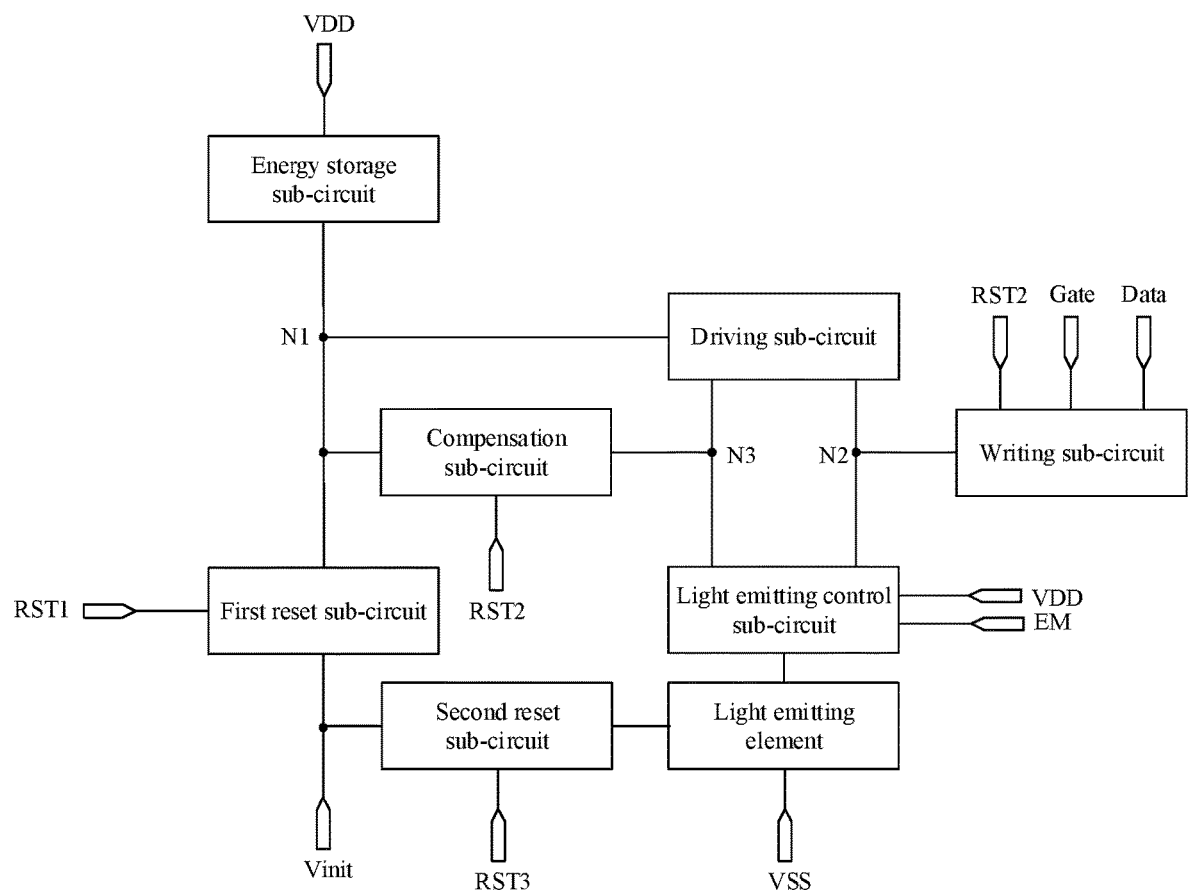
FIG. 2 is a schematic diagram of a structure of a pixel circuit provided by an exemplary embodiment.

FIG. 2 is a schematic diagram of a structure of a pixel circuit provided by an exemplary embodiment. As shown in FIG. 2, a node control sub-circuit in a pixel circuit provided by an exemplary embodiment includes a writing sub-circuit, a driving sub-circuit, a compensation sub-circuit and an energy storage sub-circuit.

The writing sub-circuit is connected respectively with a scanning signal line Gate, a second reset line RST2, a data signal line Data, and a second node N2, and is configured to provide a signal of the data signal line Data to the second node N2 under control of the scanning signal line Gate and the second reset line RST2, and to discharge to the second node N2 under control of the second reset line RST2. The driving sub-circuit is connected respectively with a first node N1, the second node N2, and a third node N3, and is configured to provide a signal of the second node N2 to the third node N3 under control of the first node N1. The compensation sub-circuit is connected respectively with the first node N1, the second reset line RST2 and the third node N3, and is configured to provide a potential of the third node N3 to the first node N1 under control of the second reset line RST2 to compensate the first node N1 until the voltage of the first node N1 meets a threshold condition. The energy storage sub-circuit is connected respectively with a first power supply line VDD and the first node N1, and is configured to store a voltage difference between the first power supply line VDD and the first node N1.

FIG. 2 shows an exemplary structure of a node control sub-circuit, and an implementation of this sub-circuit is not limited thereto.

Figure 3:
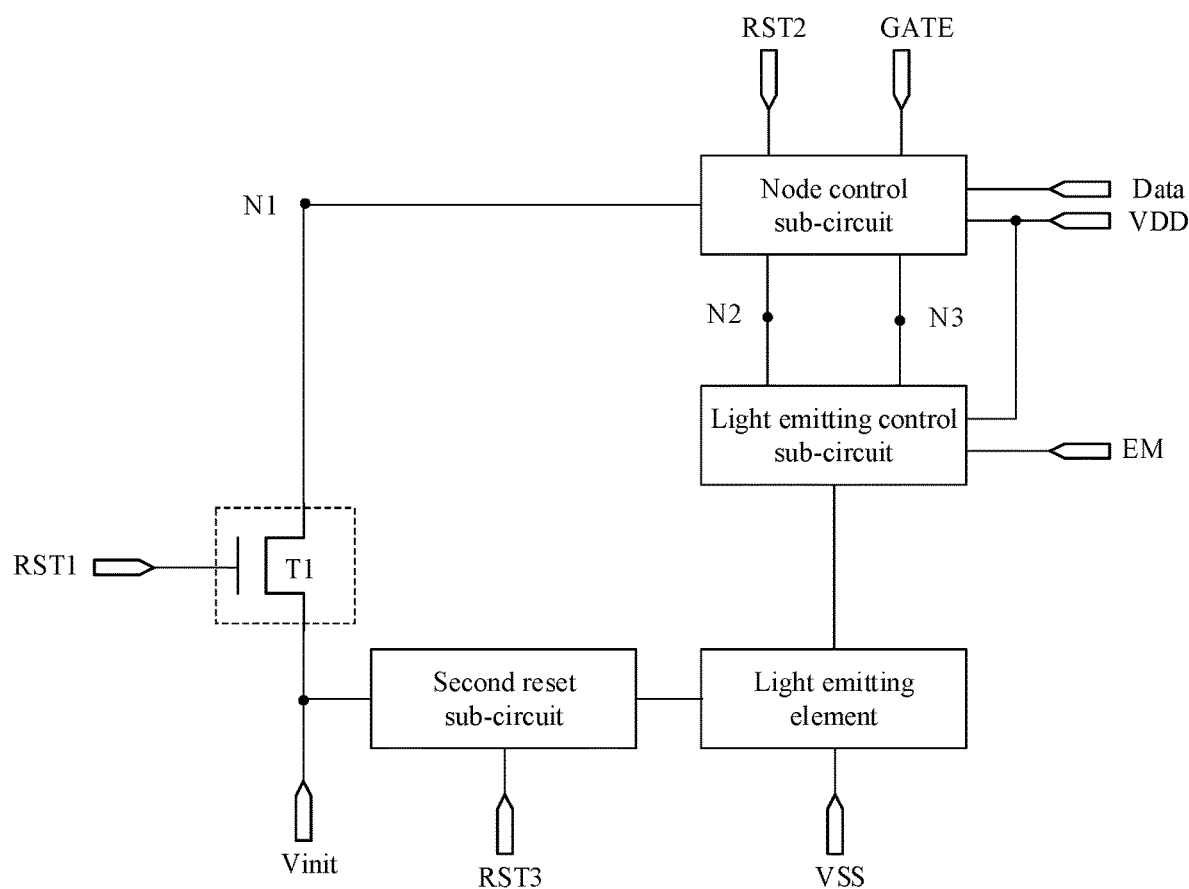
FIG. 3 is a diagram of an equivalent circuit of a first reset sub-circuit provided by an exemplary embodiment.

FIG. 3 is a diagram of an equivalent circuit of a first reset sub-circuit provided by an exemplary embodiment. As shown in FIG. 3, in an exemplary embodiment, the first reset sub-circuit includes a first transistor T1. The first transistor T1 is a switch transistor.

A control electrode of the first transistor T1 is connected with a first reset line RST1, a first electrode of the first transistor T1 is connected with an initial signal line Vinit, and a second electrode of the first transistor T1 is connected with a first node N1;

FIG. 3 shows an exemplary structure of the first reset sub-circuit, and an implementation of this sub-circuit is not limited thereto.

Figure 4:
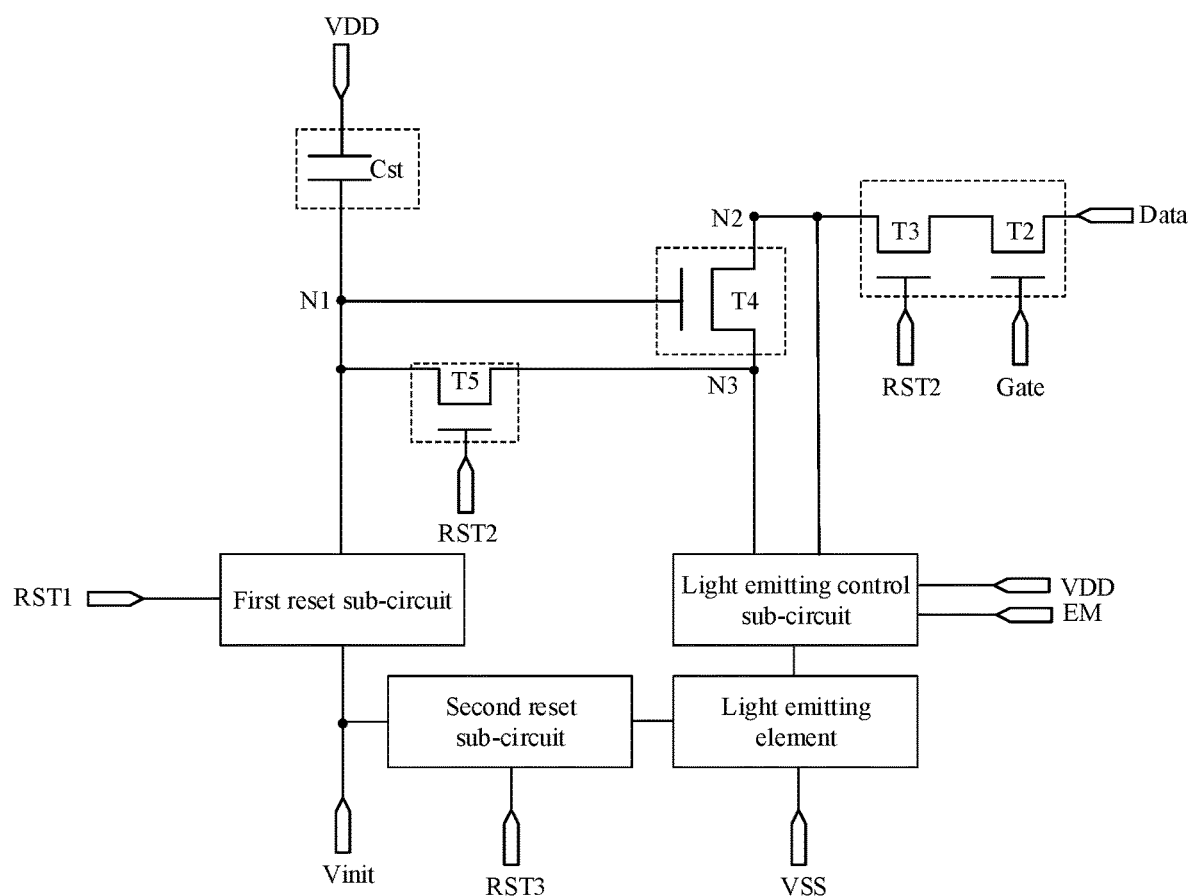
FIG. 4 is a diagram of an equivalent circuit of a node control sub-circuit provided by an exemplary embodiment.

FIG. 4 is a diagram of an equivalent circuit of a node control sub-circuit provided by an exemplary embodiment. As shown in FIG. 4, a writing sub-circuit of a node control sub-circuit in an exemplary embodiment includes a second transistor T2 and a third transistor T3. A driving sub-circuit includes a fourth transistor T4, which is a driving transistor. A energy storage sub-circuit includes a storage capacitor Cst. A compensation sub-circuit includes a fifth transistor T5. The second transistor T2, the third transistor T3, and the fifth transistor T5 are switch transistors.

A control electrode of the second transistor T2 is connected with a scanning signal line Gate, a first electrode of the second transistor T2 is connected with a data signal line Data, and a second electrode of the second transistor T2 is connected with a first electrode of the third transistor T3. A control electrode of the third transistor T3 is connected with a second reset line RST2, and a second electrode of the third transistor T3 is connected with a second node N2. A control electrode of the fourth transistor T4 is connected with a first node N1, a first electrode of the fourth transistor T4 is connected with the second node N2, and a second electrode of the fourth transistor T4 is connected with a third node N3. A control electrode of the fifth transistor T5 is connected with the second reset line RST2, a first electrode of the fifth transistor T5 is connected with the first node N1, and a second electrode of the fifth transistor T5 is connected with the third node N3. A first terminal of the storage capacitor Cst is connected with a first power supply line VDD, and a second terminal of the storage capacitor Cst is connected with the first node N1.

In an exemplary embodiment, a length of a conductive channel of the third transistor T3 is greater than a threshold length, and a width of the conductive channel of the third transistor T3 is greater than a threshold width. When the third transistor T3 is turned on, the channel region of the third transistor T3 is conductive, and a capacitance is formed between the channel region and the control electrode of the third transistor T3. Since the length of the conductive channel of the third transistor T3 is greater than the threshold length and the width of the conductive channel of the third transistor T3 is greater than the threshold width, the capacitance value of the capacitance formed between the channel region and the control electrode of the third transistor T3 is large. Then when the third transistor T3 is turned on, it is equivalent to a capacitor, and can be charged or discharged.

In an exemplary embodiment, the threshold length is a maximum value of the conductive channel lengths of the second transistor, the fourth transistor, and the fifth transistor, and the threshold width is a maximum value of the conductive channel widths of the second transistor, the fourth transistor, and the fifth transistor.

In an exemplary embodiment, the driving transistor may be an enhancement mode transistor or may be a depletion mode transistor.

In an exemplary embodiment, configured signals of the first power supply line VDD and the second power supply line VSS may make the driving transistor be in a saturated state when the driving transistor is turned on.

FIG. 4 shows an exemplary structure of the node control sub-circuit, and an implementation of this sub-circuit is not limited thereto.

Figure 5:
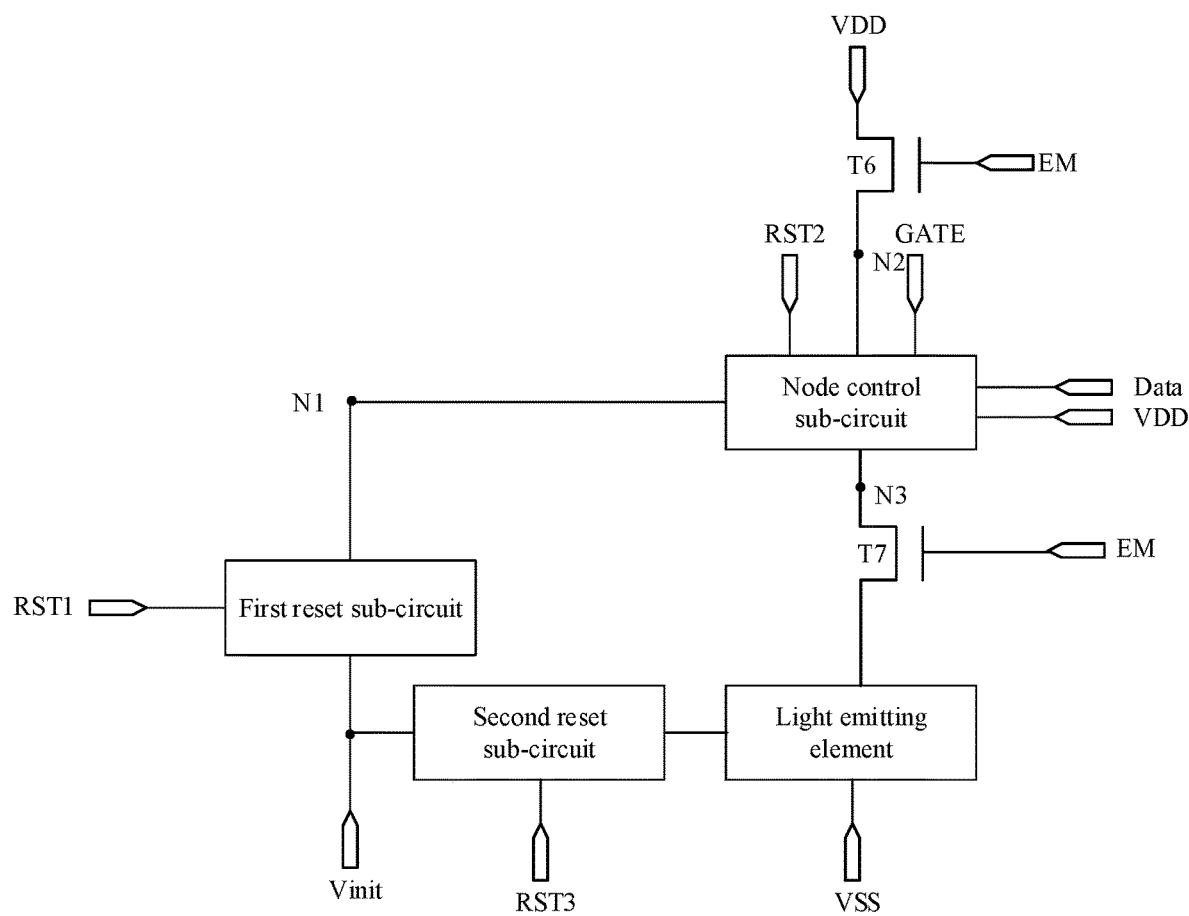
FIG. 5 is a diagram of an equivalent circuit of a light emitting control sub-circuit provided by an exemplary embodiment.

FIG. 5 is a diagram of an equivalent circuit of a light emitting control sub-circuit provided by an exemplary embodiment. As shown in FIG. 5, in an exemplary embodiment, the light emitting control sub-circuit includes a sixth transistor T6 and a seventh transistor T7. The sixth transistor T6 and the seventh transistor T7 are switch transistors.

A control electrode of the sixth transistor T6 is connected with a light emitting control line EM, a first electrode of the sixth transistor T6 is connected with a first power supply line VDD, and a second electrode of the sixth transistor T6 is connected with a second node N2. A control electrode of the seventh transistor T7 is connected with the light emitting control line EM, a first electrode of the seventh transistor T7 is connected with a third node N3, and a second electrode of the seventh transistor T7 is connected with a light emitting element.

FIG. 5 shows an exemplary structure of the light emitting control sub-circuit, and an implementation of this sub-circuit is not limited thereto.

Figure 6:
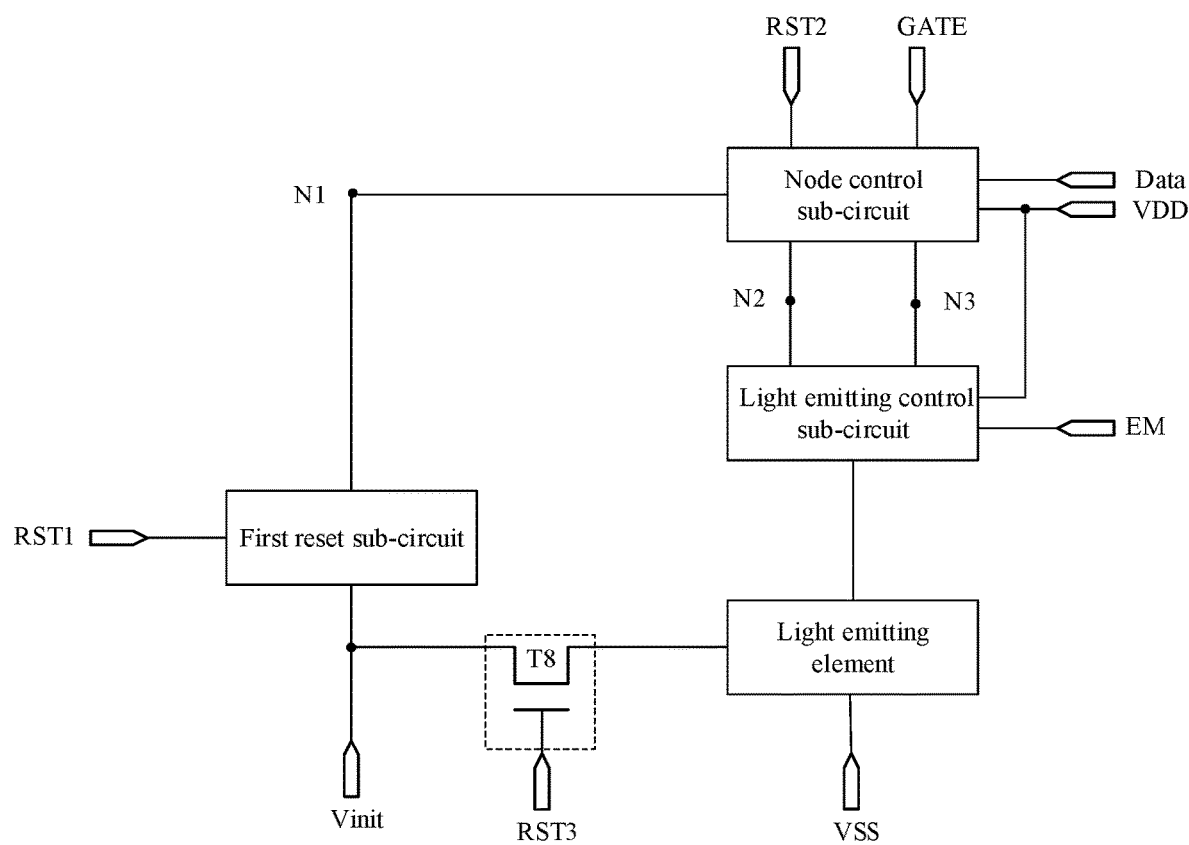
FIG. 6 is a diagram of an equivalent circuit of a second reset sub-circuit provided by an exemplary embodiment.

FIG. 6 is a diagram of an equivalent circuit of a second reset sub-circuit provided by an exemplary embodiment. As shown in FIG. 6, in an exemplary embodiment, the second reset sub-circuit includes an eighteenth transistor T8. The eighth transistor T8 is a switch transistor.

A control electrode of the eighth transistor T8 is connected with a third reset line RST3, a first electrode of the eighth transistor T8 is connected with an initial signal line Vinit, and a second electrode of the eighth transistor T8 is connected with a light emitting element.

In an exemplary embodiment, the second reset sub-circuit is disposed so as to eliminate an interface charge in the light emitting element and improve the display effect of the display product.

FIG. 6 shows an exemplary structure of the second reset sub-circuit, and an implementation of this sub-circuit is not limited thereto.

Figure 7:
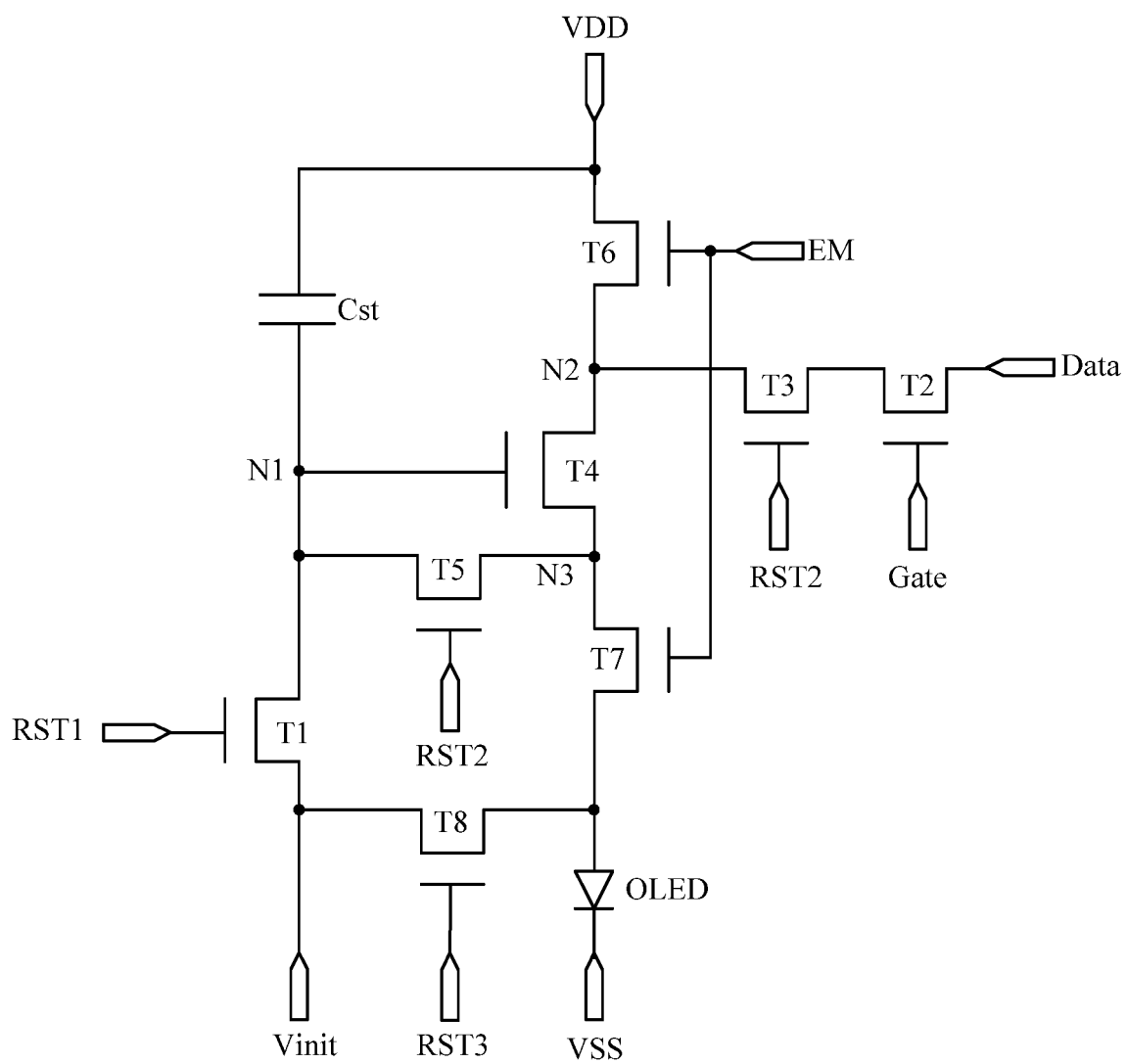
FIG. 7 is a diagram of an equivalent circuit of a pixel circuit provided by an exemplary embodiment.

FIG. 7 is a diagram of an equivalent circuit of a pixel circuit provided by an exemplary embodiment. As shown in FIG. 7, in an exemplary embodiment, a first reset sub-circuit includes a first transistor T1; a node control sub-circuit includes a second transistor T2, a third transistor T3, a fourth transistor T4, a fifth transistor T5 and a storage capacitor Cst, wherein the fourth transistor T4 is a driving transistor; a light emitting control sub-circuit includes a sixth transistor T6 and a seventh transistor T7; and a second reset sub-circuit includes an eighth transistor T8.

A control electrode of the first transistor T1 is connected with a first reset line RST1, a first electrode of the first transistor T1 is connected with an initial signal line Vinit, and a second electrode of the first transistor T1 is connected with a first node N1. A control electrode of the second transistor T2 is connected with a scanning signal line Gate, a first electrode of the second transistor T2 is connected with a data signal line Data, and a second electrode of the second transistor T2 is connected with a first electrode of the third transistor T3. A control electrode of the third transistor T3 is connected with a second reset line RST2, and a second electrode of the third transistor T3 is connected with a second node N2. A control electrode of the fourth transistor T4 is connected with the first node N1, a first electrode of the fourth transistor T4 is connected with the second node N2, and a second electrode of the fourth transistor T4 is connected with a third node N3. A control electrode of the fifth transistor T5 is connected with the second reset line RST2, a first electrode of the fifth transistor T5 is connected with the first node N1, and a second electrode of the fifth transistor T5 is connected with the third node N3. A first terminal of the storage capacitor Cst is connected with a first power supply line VDD, and a second terminal of the storage capacitor Cst is connected with the first node N1. A control electrode of the sixth transistor T6 is connected with a light emitting control line EM, a first electrode of the sixth transistor T6 is connected with the first power supply line VDD, and a second electrode of the sixth transistor T6 is connected with the second node N2. A control electrode of the seventh transistor T7 is connected with the light emitting control line EM, a first electrode of the seventh transistor T7 is connected with the third node N3, and a second electrode of the seventh transistor T7 is connected with a light emitting element. A control electrode of the eighth transistor T8 is connected with a third reset line RST3, a first electrode of the eighth transistor T8 is connected with the initial signal line Vinit, and a second electrode of the eighth transistor T8 is connected with the light emitting element.

In an exemplary embodiment, an anode of the organic light emitting diode is connected with the second electrode of the seventh transistor T7, and a cathode of the organic light emitting diode is connected with a second power supply line VSS.

In an exemplary embodiment, the transistors T1 to T8 may all be N-type thin film transistors, or P-type thin film transistors. The types of the transistors T1 to T8 may be the same or may be different. When the types of the transistors T1 to T8 are the same, the process flows can be unified, and the number of processes can be reduced, which are beneficial to improving the yield of products.

In an exemplary embodiment, the transistors T1 to T8 may be low temperature polysilicon thin film transistors. The low temperature polysilicon thin film transistors can reduce drain electrodes in the pixel circuit and improve the performance of the pixel circuit.

In an exemplary embodiment, the transistors T1 to T8 may be of a bottom gate structure or a top gate structure.

In an exemplary embodiment, the threshold condition is that the voltage of the first node N1 is equal to the difference between the voltage of the signal of the data signal line Data and the absolute value of the threshold voltage of the fourth transistor T4, so that the driving current flowing to the light emitting element is irrelevant to the threshold voltage of the driving transistor, and the uniformity of the display product is ensured.

In an exemplary embodiment, the scanning signal line Gate and the third reset line RST3 may be different signal lines or may be the same signal line. When the scanning signal line and the third reset line are the same signal line, the number of signal lines in the pixel circuit can be reduced and the area occupied by the pixel circuit can be reduced.

A pixel circuit provided by an exemplary embodiment will be described below through a working process of the pixel circuit.

Figure 8:
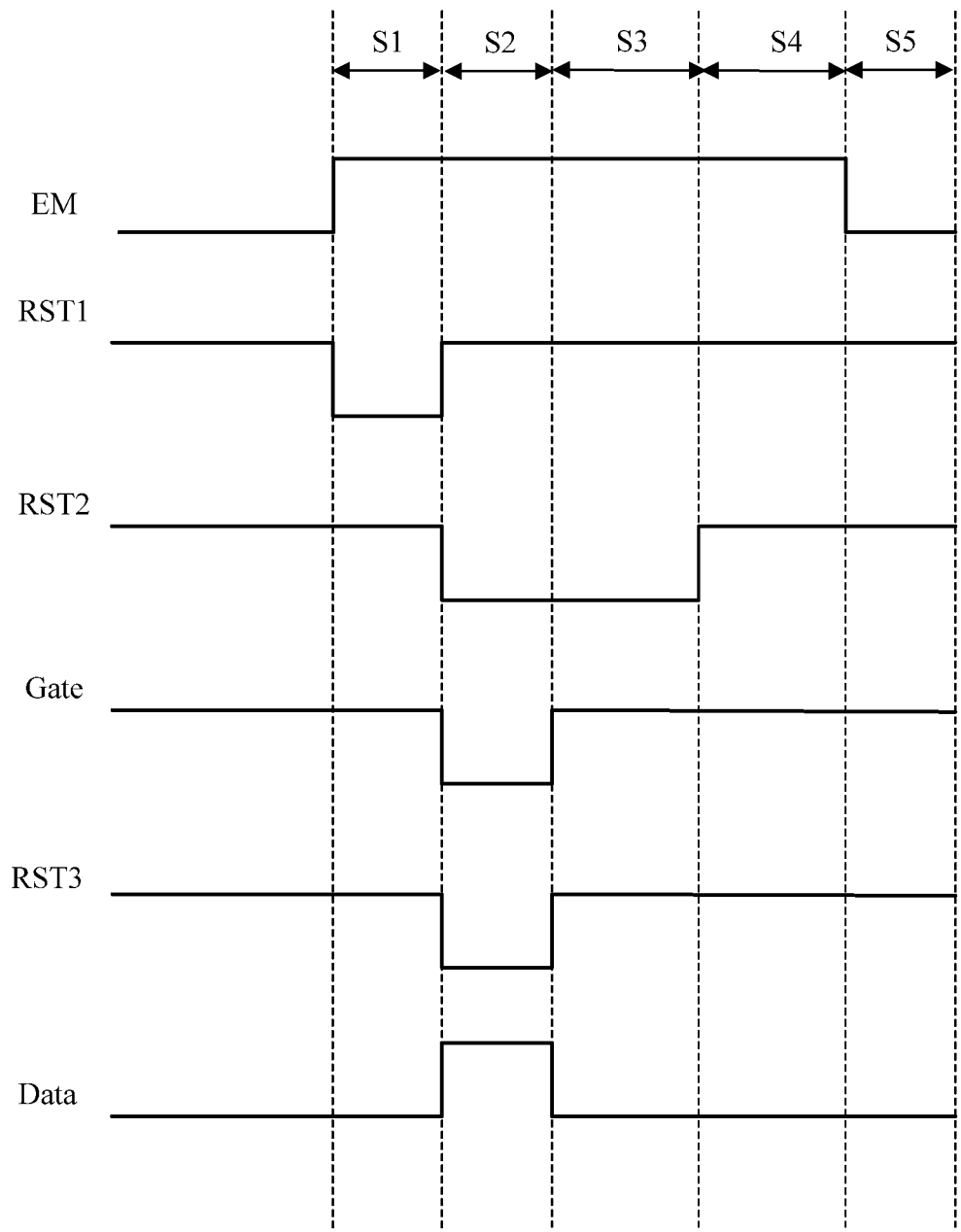
FIG. 8 is a diagram of a working sequence of a pixel circuit provided by an exemplary embodiment.
Figure 9A:
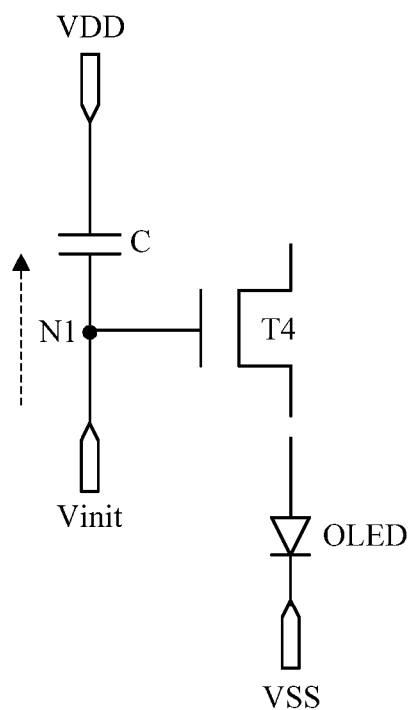
FIG. 9A is a diagram of an equivalent circuit of a pixel circuit in a first stage provided by an exemplary embodiment.
Figure 9B:
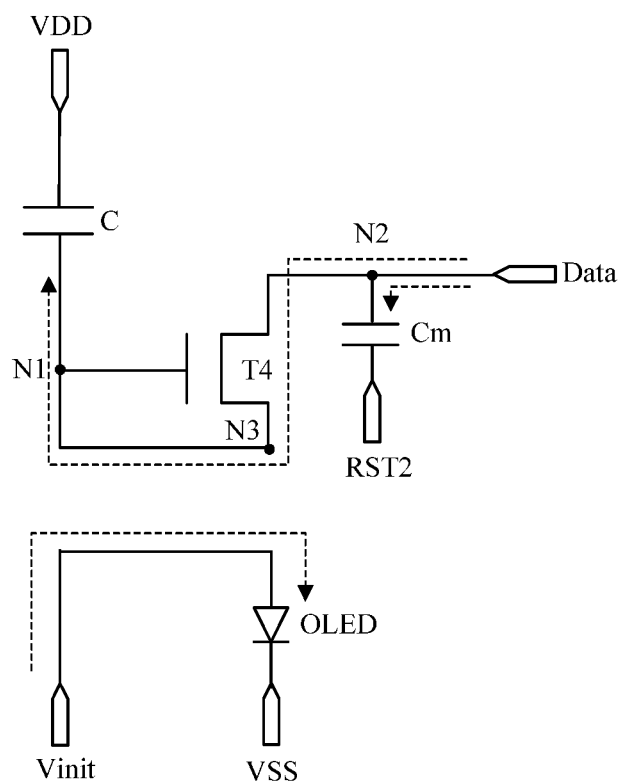
FIG. 9B is a diagram of an equivalent circuit of a pixel circuit in a second stage provided by an exemplary embodiment.
Figure 9C:
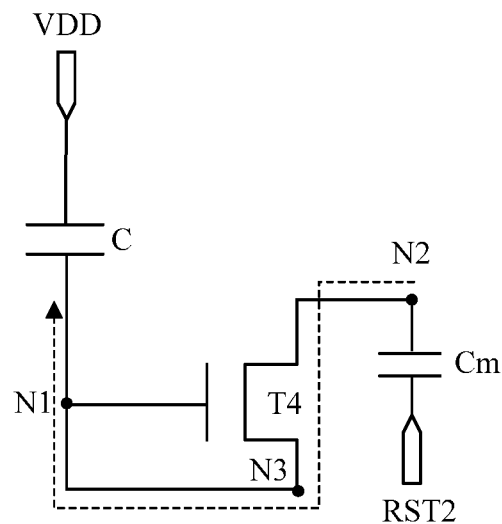
FIG. 9C is a diagram of an equivalent circuit of a pixel circuit in a third stage provided by an exemplary embodiment.
Figure 9D:
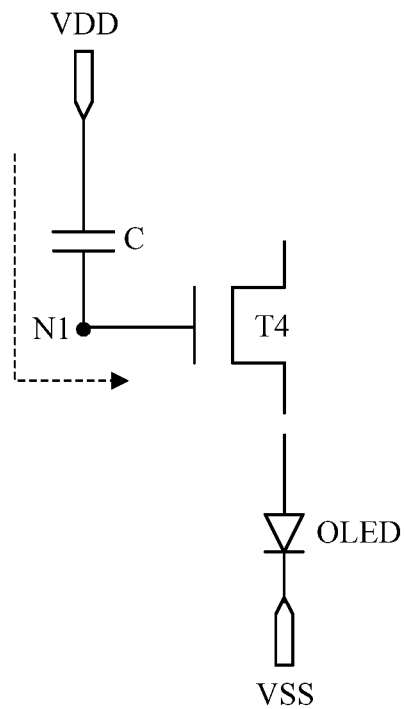
FIG. 9D is a diagram of an equivalent circuit of a pixel circuit in a fourth stage provided by an exemplary embodiment.
Figure 9E:
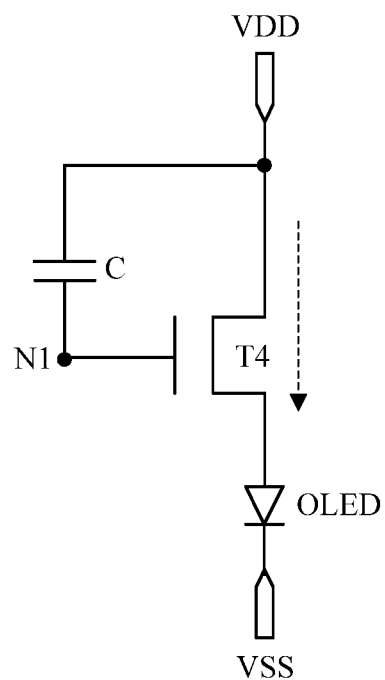
FIG. 9E is a diagram of an equivalent circuit of a pixel circuit in a fifth stage provided by an exemplary embodiment.

The transistors T1 to T8 in the pixel circuit are all P-type transistors as an example. FIG. 8 is a diagram of a working sequence of the pixel circuit provided by an exemplary embodiment. FIG. 9A is a diagram of an equivalent circuit of the pixel circuit in a first stage provided by an exemplary embodiment. FIG. 9B is a diagram of an equivalent circuit of the pixel circuit in a second stage provided by an exemplary embodiment. FIG. 9C is a diagram of an equivalent circuit of the pixel circuit in a third stage provide by an exemplary embodiment. FIG. 9D is a diagram of an equivalent circuit of the pixel circuit in a fourth stage provided by an exemplary embodiment. FIG. 9E is a diagram of an equivalent circuit of the pixel circuit in a fifth stage provided by an exemplary embodiment. As shown in FIGS. 7 to 9, a pixel circuit in an exemplary embodiment includes seven switch transistors (T1, T2, T3, T5, T6, T7, and T8), one driving transistor (T4), one capacitor unit (Cst), six input signal lines (Gate, RST1, RST2, RST3, EM, and Data), and three power supply lines (VDD, VSS, and Vinit).

The first power supply line VDD continuously provides a high level signal, and the second power supply line VSS and the initial signal line Vinit continuously provide low level signals.

A pixel circuit provided by an exemplary embodiment includes a first stage S1 to a fifth stage S5.

In the first stage S1 which is a reset stage, as shown in FIG. 9A, the input signal of the first reset line RST1 is at a low level, the first transistor T1 is turned on, and the initial signal of the initial signal line Vinit is provided to the first node N1 to begin to charge the first node N1, and the storage capacitor Cst begins to be charged, to prepare for writing a data signal in the second stage. Since the difference between the voltage value of the first node N1 and the voltage value of the second node N2 is greater than the threshold voltage of the fourth transistor, the fourth transistor T4 is turned on. The input signal of the scanning signal line Gate is at a high level, the second transistor T2 is turned off, the input signal of the second reset line RST2 is at a high level, the third transistors T3 and the fifth transistors T5 are turned off, the input signal of the light emitting control line EM is at a high level, the sixth transistors T6 and the seventh transistors T7 are turned off, the input signal of the third reset line RST3 is at a high level, and the eighth transistor T8 is turned off.

In the second stage which is a writing compensation stage, as shown in FIG. 9B, the input signal of the scanning signal line Gate is at a low level, and the second transistor T2 is turned on. The input signal of the second reset line RST2 is at a low level, and the third transistor T3 and the fifth transistor T5 are turned on. Since the second transistor T2 and the third transistor T3 are turned on, the input signal of the data signal line Data is written to the second node N2. When the third transistor T3 is turned on, the third transistor T3 functions as a capacitor Cm, the capacitor Cm is charged by the input signal of the data signal line Data through the second transistor T2, and the storage capacitor Cst is charged by the input signal of the data signal line Data through the second transistor T2, the third transistor T3, the fourth transistor T4 and the fifth transistor T5, to compensate the first node N1. As the charging time is extended, the voltage value of the second node N2 becomes equal to the voltage value Vdata of the input signal of the data signal line Data very soon. At this point, the voltage difference across the capacitor Cm is V2 minus Vdata, where V2 is the voltage value of the second reset line RST2 in the second stage. Since the charging of the storage capacitor Cst by the input signal of the data signal line Data passes the fourth transistor T4, with the increase of the voltage value of the first node N1, the current flowing through the fourth transistor T4 becomes smaller and smaller, and the increase of the voltage value of the first node N1 becomes slower and slower. Since the opening time for each row of a high-frequency display product is less, that is, the time when the input signal of the scanning signal line Gate is at a low level is short, at the end of the second stage S2, the voltage value of the first node N1 is smaller than Vdata minus |Vth|, where Vth is the threshold voltage of the fourth transistor T4, the input signal of the scanning signal line Gate is switched to a high level, the second transistor T2 is turned off, and the writing of the input signal of the data signal line Data is finished. The input signal of the third reset line RST3 is at a low level, the eighth transistor T8 is turned on, and the input signal of the initial signal line Vinit is provided to the anode of the organic light emitting diode (OLED), to initialize the anode of the organic light emitting diode. The input signal of the first reset line RST1 is at a high level, the first transistor T1 is turned off, the input signal of the light emitting control line EM is at a high level, and the sixth transistor T6 and the seventh transistor T7 are turned off.

In the third stage S3 which is a compensation stage, as shown in FIG. 9C, the input signal of the scanning signal line Gate is at a high level, the second transistor T2 is turned off, the input signal of the second reset line RST2 is at a low level, and the third transistor T3 and the fifth transistor T5 are turned on. Although the second transistor T2 is turned off, and no signal is continuously written to the storage capacitor Cst, one terminal of the capacitor Cm is written with the input signal of the data signal line Data in the second stage, and at this point, the capacitor Cm starts to discharge and continuously charges the storage capacitor Cst through the fourth transistor T4 and the fifth transistor T5 to compensate the first node N1, and the voltage value of the first node N1 continues to rise until the fourth transistor T4 is turned off. At this point, the voltage value of the first node N1 meets the threshold condition, that is, the voltage value of the first node N1 is equal to Vdata minus |Vth|. Since the increase of the voltage value of the first node N1 is small in this stage and the consumption of the charge of the capacitor Cm is limited, the capacitor Cm can be approximately regarded as a constant voltage source. The input signal of the first reset line RST1 is at a high level, and the first transistor T1 is turned off. The input signal of the light emitting control line EM is at a high level, and the sixth transistor T6 and the seventh transistor T7 are turned off. The input signal of the third reset line RST3 is at a high level, and the eighth transistor T8 is turned off.

In the fourth stage S4 which is a buffer stage, as shown in FIG. 9D, the input signal of the first reset line RST1 is at a high level, and the first transistor T1 is turned off. The input signal of the scanning signal line Gate is at a high level, and the second transistor T2 is turned off. The input signal of the second reset line RST2 is at a high level, and the third transistor T3 and the fifth transistor T5 are turned off. The input signal of the light emitting control line EM is at a high level, and the sixth transistor T6 and the seventh transistor T7 are turned off. The input signal of the third reset line RST3 is at a high level, and the eighth transistor T8 is turned off. In this stage, the voltage value of the first node N1 remains unchanged.

In an exemplary embodiment, the length of the fourth stage S4 depends on the time at which the falling edge of the input signal of the light emitting control line EM occurs.

In the fifth stage which is a light emitting stage, as shown in FIG. 9E, the input signal of the light emitting control line EM is at a low level, the sixth transistor T6 and the seventh transistor T7 are turned on, the storage capacitor Cst starts to discharge, the fourth transistor T4 is turned on, and the fourth transistor T4 outputs to a driving circuit, to drive the organic light emitting diode (OLED) to emit light. The input signal of the first reset line RST1 is at a high level, and the first transistor T1 is turned off. The input signal of the scanning signal line Gate is at a high level, and the second transistor T2 is turned off. The input signal of the second reset line RST2 is at a high level, and the third transistor T3 and the fifth transistor T5 are turned off. The input signal of the third reset line RST3 is at a high level, and the eighth transistor T8 is turned off.

The driving current $I_{OLED}$ satisfies the following formula:

$$I_{OLED}=K(Vsg-|Vth|)^2=K(Vdd-(Vdata-|Vth|)-|Vth|)^2=K(Vdd-Vdata)^2$$

where Vsg is the voltage difference between the source electrode and the gate electrode of the fourth transistor, Vdd is the voltage value of the signal of the first power supply line, and K is a fixed constant related to the process parameters and geometric dimensions of the fourth transistor T4.

It can be seen from the derivation result of the above current formula that in the light emitting stage, the driving current output by the fourth transistor T4 is not affected by the threshold voltage of the fourth transistor T4, and is only related to the signal of the data signal line. Therefore, the influence of the threshold voltage of the fourth transistor T4 on the driving current is eliminated, which can ensure uniformity of the display brightness of the display product, and improve the overall display effect of the display product.

Figure 10:
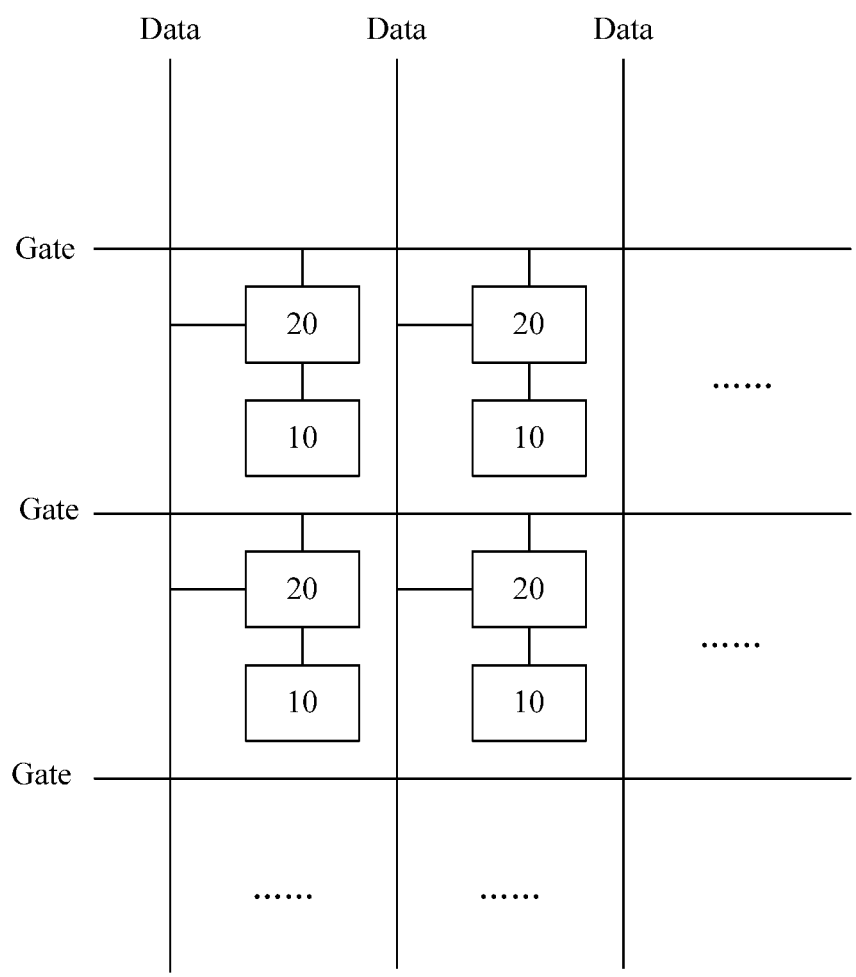
FIG. 10 is a schematic diagram of a structure of a display device provided by an embodiment of the present disclosure.
Figure 11:
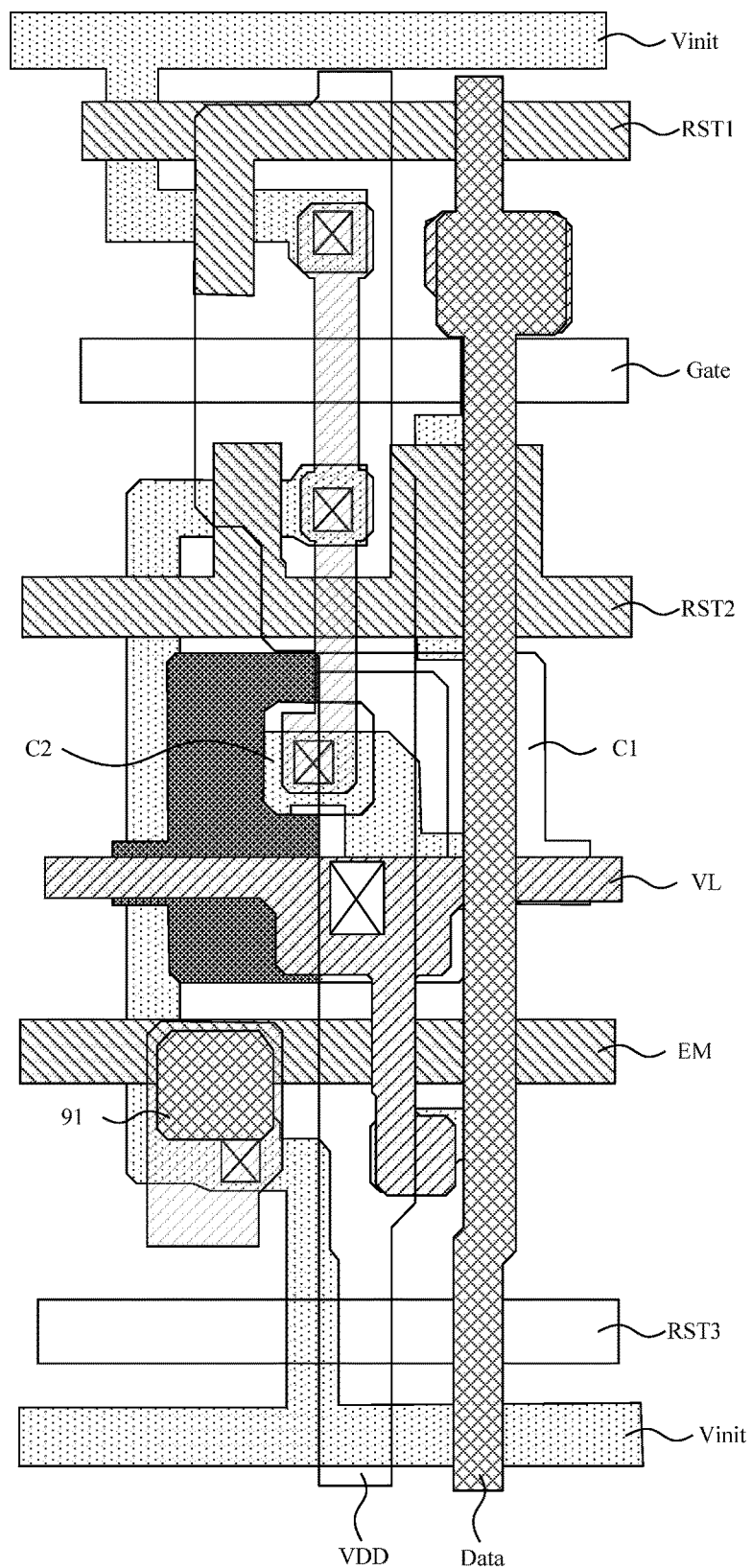
FIG. 11 is a top view of a part of a display device provided by an embodiment of the present disclosure.

FIG. 10 is a schematic diagram of a structure of a display device provided by an embodiment of the present disclosure. FIG. 11 is a top view of a part of a display device provided by an embodiment of the present disclosure. As shown in FIG. 10 and FIG. 11, the display device provided by the embodiment of the present disclosure includes light emitting elements 10 arranged in a matrix, pixel circuits 20 arranged in a matrix, a scanning signal line Gate, a data signal line Data, an initial signal line Vinit, a light emitting control line EM, a first power supply line VDD, a first reset line RST1, a second reset line RST2, and a third reset line RST3.

The pixel circuit 20 is a pixel circuit provided by any of the foregoing embodiments. The pixel circuits are in one-to-one correspondence with the light emitting elements, and the pixel circuit is configured to drive a corresponding light emitting element to emit light.

The pixel circuit includes a first reset sub-circuit, a node control sub-circuit, a light emitting control sub-circuit, and a second reset sub-circuit. The first reset sub-circuit is connected respectively with a first reset line, an initial signal line, and a first node, and is configured to provide a signal of the initial signal line to the first node under control of the first reset line. The node control sub-circuit is connected respectively with a scanning signal line, a second reset line, a data signal line, the first node, a second node, a third node and a first power supply line, and is configured to, under control of the scanning signal line, the second reset line and the first node, provide a signal of the data signal line to the second node, and compensate the first node through the second node and the third node until the voltage of the first node meets a threshold condition, and to provide a signal of the second node to the third node under control of the first node. The light emitting control sub-circuit is connected respectively with a light emitting control line, the first power supply line, the second node, the third node and a light emitting element, and is configured to provide a signal of the first power supply line to the second node and provide a signal of the third node to the light emitting element, under control of the light emitting control line. The second reset sub-circuit is connected respectively with a third reset line, the initial signal line and the light emitting element, and is configured to provide a signal of the initial signal line to the light emitting element under control of the third reset line. A third reset line connected with a pixel circuit located in an $i^{th}$ row is electrically connected with a first reset line connected with a pixel circuit located in an $(i+1)^{th}$ row, 1≤i<M, where M is the total number of rows of pixel circuits.

The display device includes a plurality of sub-pixels. Each sub-pixel includes one light emitting element and one pixel circuit. The light emitting element is connected with the pixel circuit in each sub-pixel.

In an exemplary embodiment, the display device may be any product or component having a display function such as a mobile phone, a tablet computer, a television, a display, a notebook computer, a digital photo frame, or a navigator.

In an exemplary embodiment, the display device includes a substrate and a driving structure layer and a light emitting structure layer that are sequentially disposed on the substrate. The driving structure layer includes a pixel circuit, a scanning signal line, a data signal line, an initial signal line, a light emitting control line, a first power supply line, a first reset line, a second reset line and a third reset line. The light emitting structure layer includes a light emitting element.

In an exemplary embodiment, the substrate may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIG. 11, the scanning signal line Gate, the initial signal line Vinit, the light emitting control line EM, the first reset line RST1, the second reset line RST2, and the third reset line RST3 extend along a first direction, and the data signal line Data and the first power supply line VDD extend along a second direction. The first direction intersects with the second direction.

In an exemplary embodiment, that the first direction intersects with the second direction means that an included angle between the first direction and the second direction may be about 70 degrees to 90 degrees. For example, the included angle between the first direction and the second direction may be 90 degrees.

In an exemplary embodiment, as shown in FIG. 11, each pixel circuit includes a storage capacitor. The storage capacitor includes a first plate C1 and a second plate C2. The first plate C1 is connected with a first power supply line VDD, and the second plate C2 is connected with a first node N1.

In an exemplary embodiment, an orthographic projection of the first plate C1 on the substrate is partially overlapped with an orthographic projection of the second plate C2 on the substrate; the first plate C1 is provided with a via, and the via of the first plate C1 exposes the second plate C2.

In an exemplary embodiment, as shown in FIG. 11, the scanning signal line Gate, the first reset line RST1 and the second reset line RST2 are located at one side of the second plate C2, and the light emitting control line EM and the third reset line RST3 are located at one side of the second plate C2 away from the first reset line RST1.

In an exemplary embodiment, as shown in FIG. 11, the first reset line RST1 is located at one side of the scanning signal line Gate away from the second plate C2. The second reset line RST2 is located at one side of the scanning signal line Gate close to the second plate C2. The third reset line RST3 is located at one side of the light emitting control line EM away from the second plate C2.

The initial signal line Vinit includes a first initial signal line and a second initial signal line. The first initial signal line and the first reset line are located at the same side of the second plate, and the first initial signal line is located at one side of the first reset line away from the second plate. The second initial signal line and the third reset line are located at the same side of the second plate, and the second initial signal line is located at one side of the third reset line away from the second plate.

In an exemplary embodiment, a first initial signal line connected with a pixel circuit is reused as a second initial signal line connected with a pixel circuit of a previous row, and a second initial signal line connected with the pixel circuit is reused as a first initial signal line connected with a pixel circuit of a next row.

In an exemplary embodiment, as shown in FIG. 11, the drive structure layer further includes a power supply connecting line VL and a connecting electrode 91.

In an exemplary embodiment, the power supply connecting line VL is disposed in a different layer from the first power supply line and is connected with the first power supply line VDD. The first plate C1 is connected with the first power supply line VDD through the power supply connecting line VL.

In an exemplary embodiment, an orthographic projection of the power supply connecting line VL on the substrate is at least partially overlapped with an orthographic projection of the first plate C1 on the substrate and at least partially overlapped with an orthographic projection of the first power supply line VDD on the substrate.

In an exemplary embodiment, the connecting electrode 91 is configured to connect a pixel circuit with a light emitting element.

In an exemplary embodiment, for a first transistor to an eighth transistor in a pixel circuit, each transistor includes an active layer, a control electrode, a first electrode, and a second electrode. The driving structure layer includes: an active layer, a first insulating layer, a first metal layer, a second insulating layer, a second metal layer, a third insulating layer, a third metal layer, a fourth insulating layer, a first planarization layer, a fourth metal layer and a second planarization layer sequentially disposed along a direction perpendicular to the substrate.

In an exemplary embodiment, as shown in FIG. 11, the active layer includes an initial signal line Vinit and active layers of all transistors. The initial signal line Vinit and the active layers of all transistors are disposed in a same layer and formed by a same patterning process.

In an exemplary embodiment, as shown in FIG. 11, the first metal layer includes a scanning signal line Gate, a first reset line RST1, a second reset line RST2, a second plate C2, a light emitting control line EM, a third reset line RST3, and control electrodes of all transistors. The scanning signal line Gate, the first reset line RST1, the second reset line RST2, the second plate C2, the light emitting control line EM, the third reset line RST3 and the control electrodes of all transistors are disposed in a same layer and formed by a same patterning process.

In an exemplary embodiment, a control electrode of the first transistor includes a first sub-control electrode and a second sub-control electrode disposed in a same layer. The first sub-control electrode and the second sub-control electrode are an integrally formed structure.

In an exemplary embodiment, the control electrode of the first transistor, a control electrode of the second transistor, a control electrode of the third transistor and a control electrode of the fifth transistor are located at a first side of the second plate, and a control electrode of the sixth transistor, a control electrode of the seventh transistor and a control electrode of the eighth transistor are located at a second side of the second plate, and the first side and the second side are opposite to each other.

In an exemplary embodiment, the control electrode of the second transistor is located at one side of the control electrode of the first transistor close to the second plate; the control electrode of the third transistor is located at one side of the control electrode of the second transistor close to the second plate; the control electrode of the third transistor and the control electrode of the fifth transistor are an integrally formed structure; the second plate and a control electrode of the fourth transistor are an integrally formed structure; the control electrode of the sixth transistor and the control electrode of the seventh transistor are an integrally formed structure, and the control electrode of the eighth transistor is located at one side of the control electrode of the seventh transistor away from the second plate.

In an exemplary embodiment, as shown in FIG. 11, the second metal layer includes a first plate C1.

In an exemplary embodiment, as shown in FIG. 11, the third metal layer includes a power supply connecting line VL and a first electrode or a second electrode of a part of the transistors. In an exemplary embodiment, the third metal layer includes a power supply connecting line VL, a second electrode of the first transistor, a first electrode of the second transistor, a first electrode of the fifth transistor, a first electrode of the sixth transistor, a second electrode of the seventh transistor, and a second electrode of the eighth transistor.

In an exemplary embodiment, the power supply connecting line, the second electrode of the first transistor, the first electrode of the second transistor, the first electrode of the fifth transistor, the first electrode of the sixth transistor, the second electrode of the seventh transistor and the second electrode of the eighth transistor are disposed in a same layer and formed by a same patterning process.

In an exemplary embodiment, the second electrode of the seventh transistor and the second electrode of the eighth transistor are the same electrode, and the second electrode of the first transistor and the first electrode of the fifth transistor are the same electrode.

In an exemplary embodiment, the active layer is also reused as a first electrode or a second electrode of the transistors except the first electrode or the second electrode of the part of the transistors included in the third metal layer. That is, the active layer is reused as a first electrode of the first transistor, a second electrode of the second transistor, a first electrode and a second electrode of the third transistor, a first electrode and a second electrode of the fourth transistor, a second electrode of the fifth transistor, a second electrode of the sixth transistor, a first electrode of the seventh transistor and a first electrode of the eighth transistor.

In an exemplary embodiment, the second electrode of the second transistor and the first electrode of the third transistor are the same electrode. The first electrode of the fourth transistor and the second electrode of the sixth transistor are the same electrode. The second electrode of the fourth transistor and the second electrode of the fifth transistor are the same electrode.

In an exemplary embodiment, as shown in FIG. 11, the fourth metal layer includes a first power supply line VDD, a data signal line Data and a pixel electrode 91. The first power supply line VDD, the data signal line Data and the pixel electrode 91 are disposed in a same layer and formed by a same patterning process.

In an exemplary embodiment, the control electrode of the first transistor includes a first sub-control electrode and a second sub-control electrode disposed in a same layer.

In an exemplary embodiment, the first insulating layer, the second insulating layer, and the third insulating layer are provided with a first via, a second via, a third via, a fourth via, and a fifth via; the second insulating layer and the third insulating layer are provided with a sixth via; the third insulating layer is provided with a seventh via; the fourth insulating layer and the first planarization layer are provided with an eighth via, a ninth via and a tenth via; and the second planarization layer includes an eleventh via.

The first via exposes the active layer of the first transistor, and the second electrode of the first transistor is connected with the active layer of the first transistor through the first via. The second via exposes the active layer of the second transistor, and the first electrode of the second transistor is connected with the active layer of the second transistor through the second via. The third via exposes the active layer of the fifth transistor, and the first electrode of the fifth transistor is connected with the active layer of the fifth transistor through the third via. The fourth via exposes the active layer of the seventh transistor, and the second electrode of the seventh transistor is connected with the active layer of the seventh transistor through the fourth via. The fifth via exposes the active layer of the sixth transistor, and the first electrode of the sixth transistor is connected with the active layer of the sixth transistor through the fifth via. The sixth via exposes the second plate, and the first electrode of the fifth transistor is connected with the second plate through the sixth via. The seventh via exposes the first plate, and the power supply connecting line is connected with the first plate through the seventh via. The eighth via exposes the first electrode of the second transistor, and the data signal line is connected with the first electrode of the second transistor through the eighth via. The ninth via exposes the power supply connecting line, and the first power supply line is connected with the power supply connecting line through the ninth via. The tenth via exposes the second electrode of the seventh transistor, and the connecting electrode is connected with the second electrode of the seventh transistor through the tenth via. The eleventh via exposes the connecting electrode, and the light emitting element is connected with the connecting electrode through the eleventh via.

In an exemplary embodiment, the light emitting element includes a first electrode, a second electrode and an organic light emitting layer; the first electrode is located on one side of the organic light emitting layer close to the substrate, and the second electrode is located on one side of the organic light emitting layer away from the substrate.

In an exemplary embodiment, the light emitting structure layer includes a pixel definition layer, a transparent conductive layer, an organic material layer, and a conductive layer, wherein the transparent conductive layer includes a first electrode, the organic material layer includes an organic light emitting layer, and the conductive layer includes a second electrode.

In an exemplary embodiment, the transistors used in the pixel circuit may all be thin film transistors or field effect transistors or other switch devices with identical properties. The transistors are all thin film transistors as an example herein. For example, the active layer (channel region) of the transistor is made of a semiconductor material, such as polysilicon (e.g., low temperature polysilicon or high temperature polysilicon), amorphous silicon, indium gallium tin oxide (IGZO), or the like, and the control electrode, the first electrode, the second electrode, etc., are made of a metal material, such as metallic aluminum or aluminum alloy. The first electrode and the second electrode of the transistors used herein may be symmetrical in structure, so there may be no difference between the first electrode and the second electrode in structure.

A structure of a display device provided by an exemplary embodiment is described below through a preparation process of the display device. A "patterning process" includes processes such as film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a thin film layer prepared from a material on a substrate by a process of deposition or coating. If a patterning process is not needed for the "thin film" during the whole preparation process, the "thin film" may also be referred to as a "layer". When a patterning process is needed for the "thin film" during the whole preparation process, the thin film is referred to as a "thin film" before the patterning process and referred to as a "layer" after the patterning process. "A and B are disposed in a same layer" mentioned in the present disclosure means that A and B are simultaneously formed by a same patterning process.

FIG. 12 to FIG. 19 are schematic diagrams of a preparation process of a display device provided by an exemplary embodiment, illustrating a layout structure of one sub-pixel in the display device. Each sub-pixel includes one pixel circuit. The pixel circuit includes a first transistor T1 to an eighth pixel transistor T8 and a storage capacitor. The storage capacitor includes a first plate C1 and a second plate C2.

Figure 12:
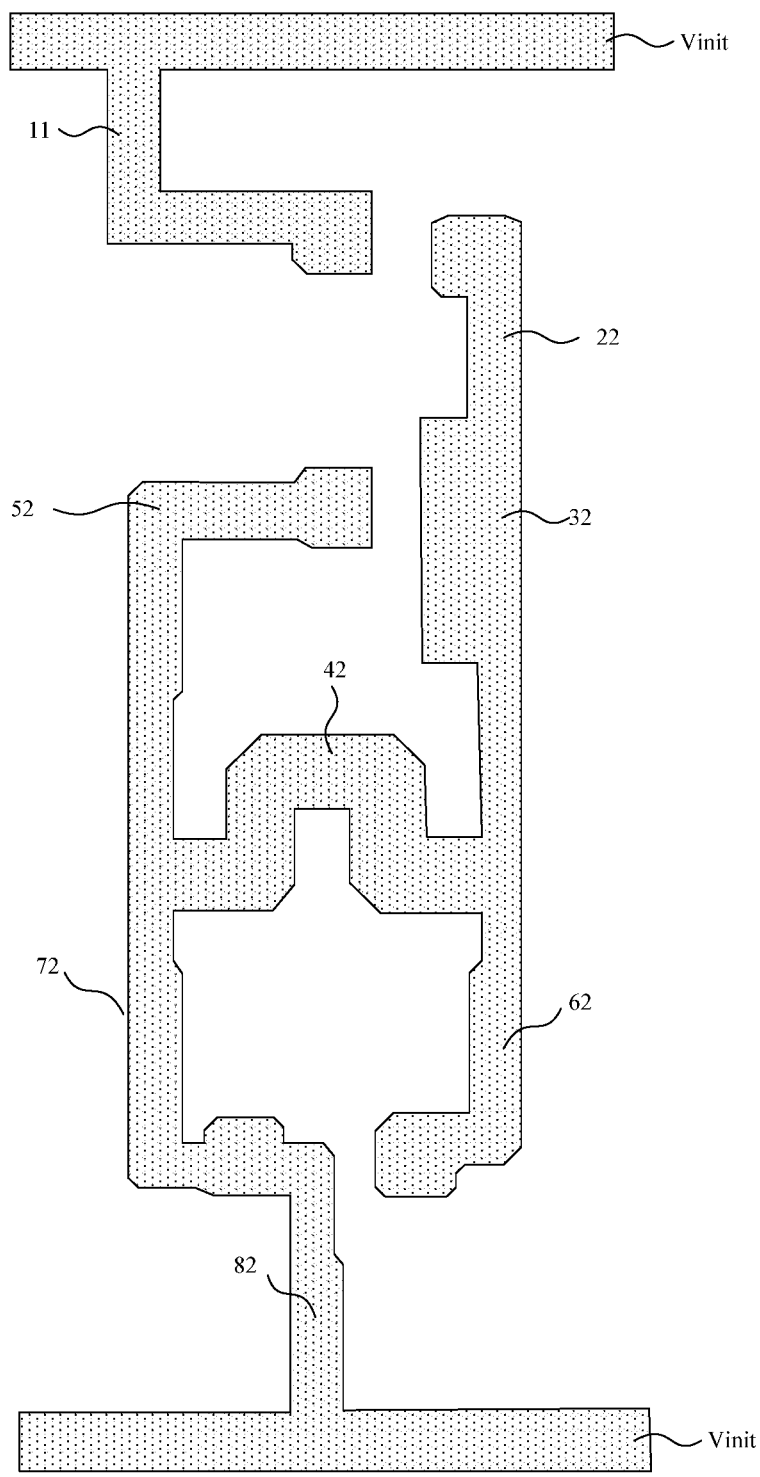
FIG. 12 is a schematic diagram of forming an active layer.

(1) Forming an active layer on a substrate, including: depositing a semiconductor thin film on the substrate, and patterning the semiconductor thin film by a patterning process, to form an active layer. The active layer includes an initial signal line Vinit, an active layer 11 of a first transistor, an active layer 21 of a second transistor, an active layer 31 of a third transistor, an active layer 41 of a fourth transistor, an active layer 51 of a fifth transistor, an active layer 61 of a sixth transistor, an active layer 71 of a seventh transistor, and an active layer 81 of an eighth transistor, as shown in FIG. 12.

Figure 13:
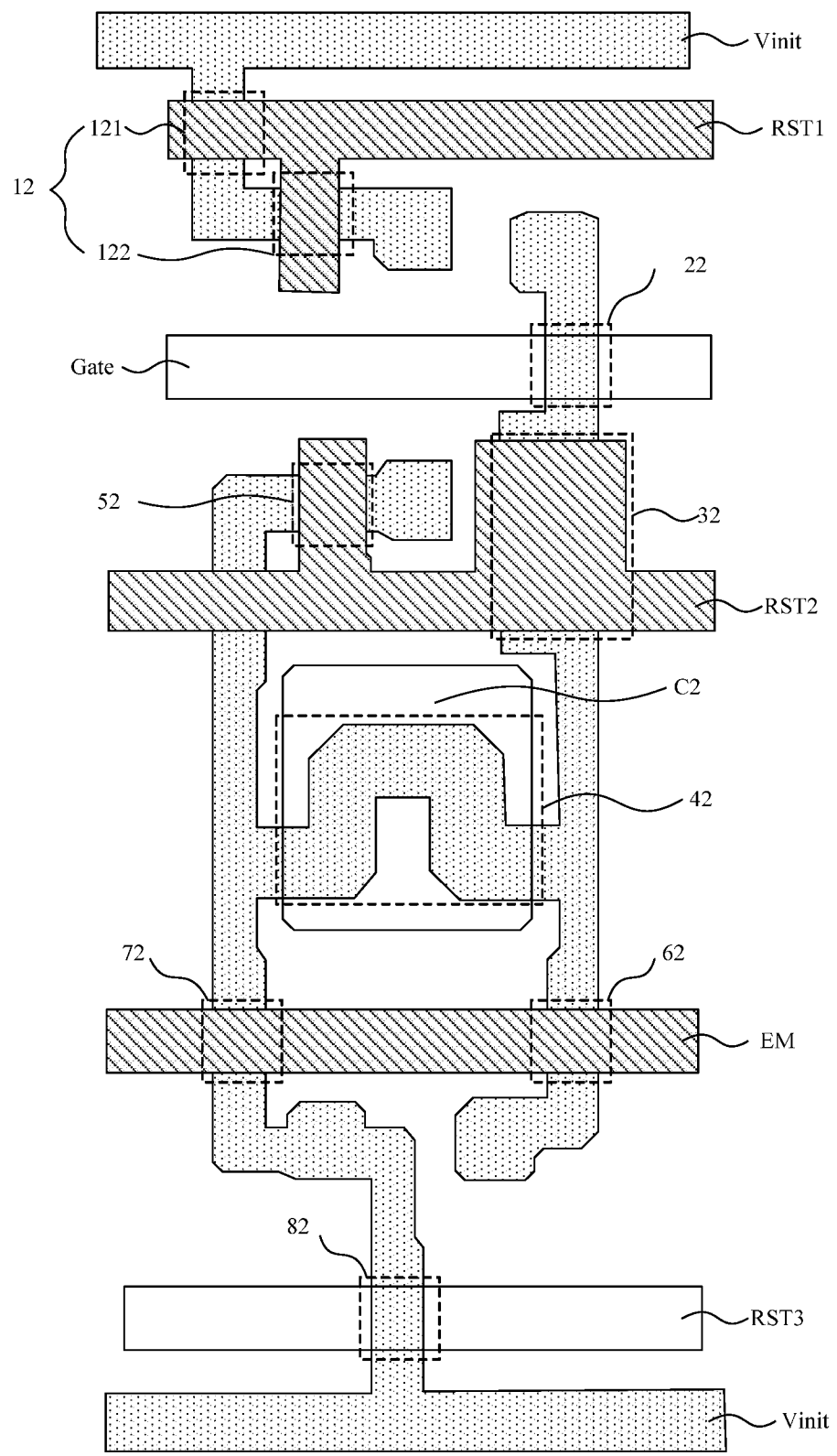
FIG. 13 is a schematic diagram of forming a first metal layer.

(2) Forming a first metal layer, including: depositing a first insulating thin film on the substrate where the active layer has been formed, and patterning the first insulating thin film by a patterning process, to form a first insulating layer; depositing a first metal thin film on the first insulating layer, and patterning the first metal thin film by a patterning process, to form the first metal layer. The first metal layer includes: a scanning signal line Gate, a first reset line RST1, a second reset line RST2, a second plate C2, a light emitting control line EM, a third reset line RST3, a control electrode 12 of the first transistor, a control electrode 22 of the second transistor, a control electrode 32 of the third transistor, a control electrode 42 of the fourth transistor, a control electrode 52 of the fifth transistor, a control electrode 62 of the sixth transistor, a control electrode 72 of the seventh transistor and a control electrode 82 of the eighth transistor, wherein the control electrode 12 of the first transistor includes a first sub-control electrode 121 and a second sub-control electrode 122, as shown in FIG. 13.

In an exemplary embodiment, the first reset line RST1, the scanning signal line Gate, the second reset line RST2, the light emitting control line EM, and the third reset line RST3 are arranged in parallel and extend along a first direction. The first reset line RST1, the scanning signal line Gate, and the second reset line RST2 are located at a first side of the second plate C2, and the light emitting control line EM and the third reset line RST3 are located at a second side of the second plate C2. The first side and the second side are opposite to each other.

In an exemplary embodiment, the control electrode 12 of the first transistor is connected with the first reset line RST1 to form an integrated structure and disposed across the active layer 11 of the first transistor. The control electrode 22 of the second transistor is connected with the scanning signal line Gate to form an integrated structure and disposed across the active layer 21 of the second transistor. The control electrode 32 of the third transistor is connected with the second reset line RST2 to form an integrated structure and disposed across the active layer 31 of the third transistor. The control electrode 42 of the fourth transistor is connected with the second plate C2 to form an integrated structure and disposed across the active layer 41 of the fourth transistor. The control electrode 52 of the fifth transistor is connected with the second reset line RST2 to form an integrated structure and disposed across the active layer 51 of the fifth transistor. The control electrode 62 of the sixth transistor is connected with the light emitting control line EM to form an integrated structure and disposed across the active layer 61 of the sixth transistor. The control electrode 72 of the seventh transistor is connected with the light emitting control line EM to form an integrated structure and disposed across the active layer 71 of the seventh transistor. The control electrode 82 of the eighth transistor is connected with the third reset line RST3 to form an integrated structure and disposed across the active layer 81 of the eighth transistor.

In an exemplary embodiment, this process further includes a conductivity treatment. The conductivity treatment is to perform a plasma treatment on the active layer by using the control electrode 12 of the first transistor, the control electrode 22 of the second transistor, the control electrode 32 of the third transistor, the control electrode 42 of the fourth transistor, the control electrode 52 of the fifth transistor, the control electrode 62 of the sixth transistor, the control electrode 72 of the seventh transistor and the control electrode 82 of the eighth transistor as shields, after the first metal layer is formed. The active layer in regions shielded by the control electrode 12 of the first transistor, the control electrode 22 of the second transistor, the control electrode 32 of the third transistor, the control electrode 42 of the fourth transistor, the control electrode 52 of the fifth transistor, the control electrode 62 of the sixth transistor, the control electrode 72 of the seventh transistor and the control electrode 82 of the eighth transistor serves as channel regions of the transistors, and the active layer in a region not shielded by the first metal layer is treated into a conductive layer to form a conductive source-drain region and an initial signal line.

Figure 14:
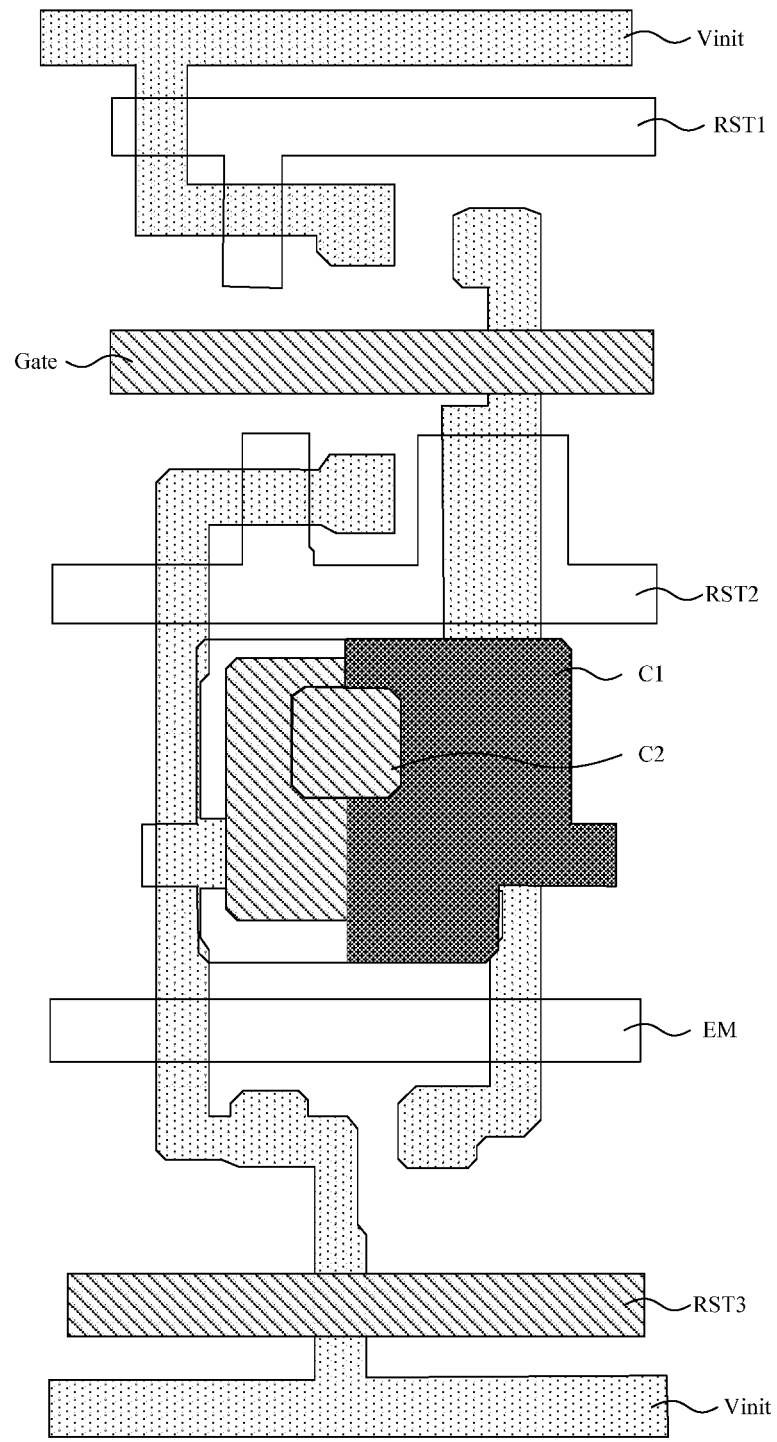
FIG. 14 is a schematic diagram of forming a second metal layer.

(3) Forming a second metal layer, including: depositing a second insulating thin film on the substrate where the first metal layer has been formed, and patterning the second insulating thin film by a patterning process, to form a second insulating layer; depositing a second metal thin film on the substrate where the second insulating layer has been formed, and patterning the second metal thin film by a patterning process, to form a second metal layer. The second metal layer includes a first plate C1, as shown in FIG. 14.

In an exemplary embodiment, an orthographic projection of the first plate C1 on the substrate is at least partially overlapped with an orthographic projection of the second plate C2 on the substrate. The first plate C1 is provided with a via that exposes the second plate C2.

Figure 15:
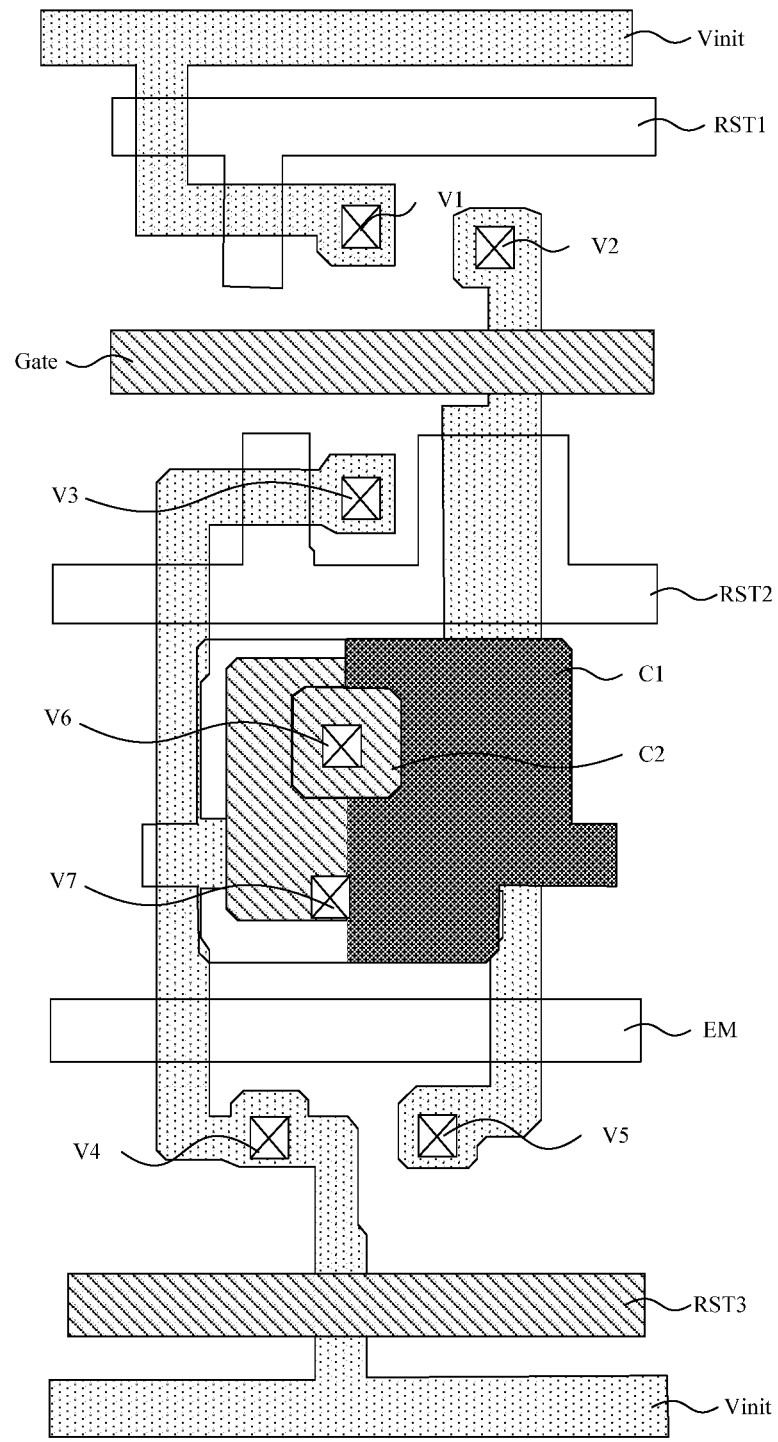
FIG. 15 is a schematic diagram of forming a third insulating layer.

(4) Forming a third insulating layer, including: depositing a third insulating thin film on the substrate where the second metal layer has been formed, and patterning the third insulating thin film by a patterning process, to form a third insulating layer. The formed third insulating layer is provided with a plurality of vias. The plurality of vias include a first via V1, a second via V2, a third via V3, a fourth via V4, and a fifth via V5 penetrating the first insulating layer, the second insulating layer, and the third insulating layer, a sixth via V6 penetrating the second insulating layer and the third insulating layer, and a seventh via V7 penetrating only the third insulating layer, as shown in FIG. 15.

In an exemplary embodiment, the first via V1 exposes the active layer 11 of the first transistor. The second via V2 exposes the active layer 21 of the second transistor. The third via V3 exposes the active layer 51 of the fifth transistor. The fourth via V4 exposes the active layer 71 of the seventh transistor. The fifth via V5 exposes the active layer 61 of the sixth transistor. The sixth via V6 exposes the second plate C2. The seventh via V7 exposes the first plate C1.

Figure 16:
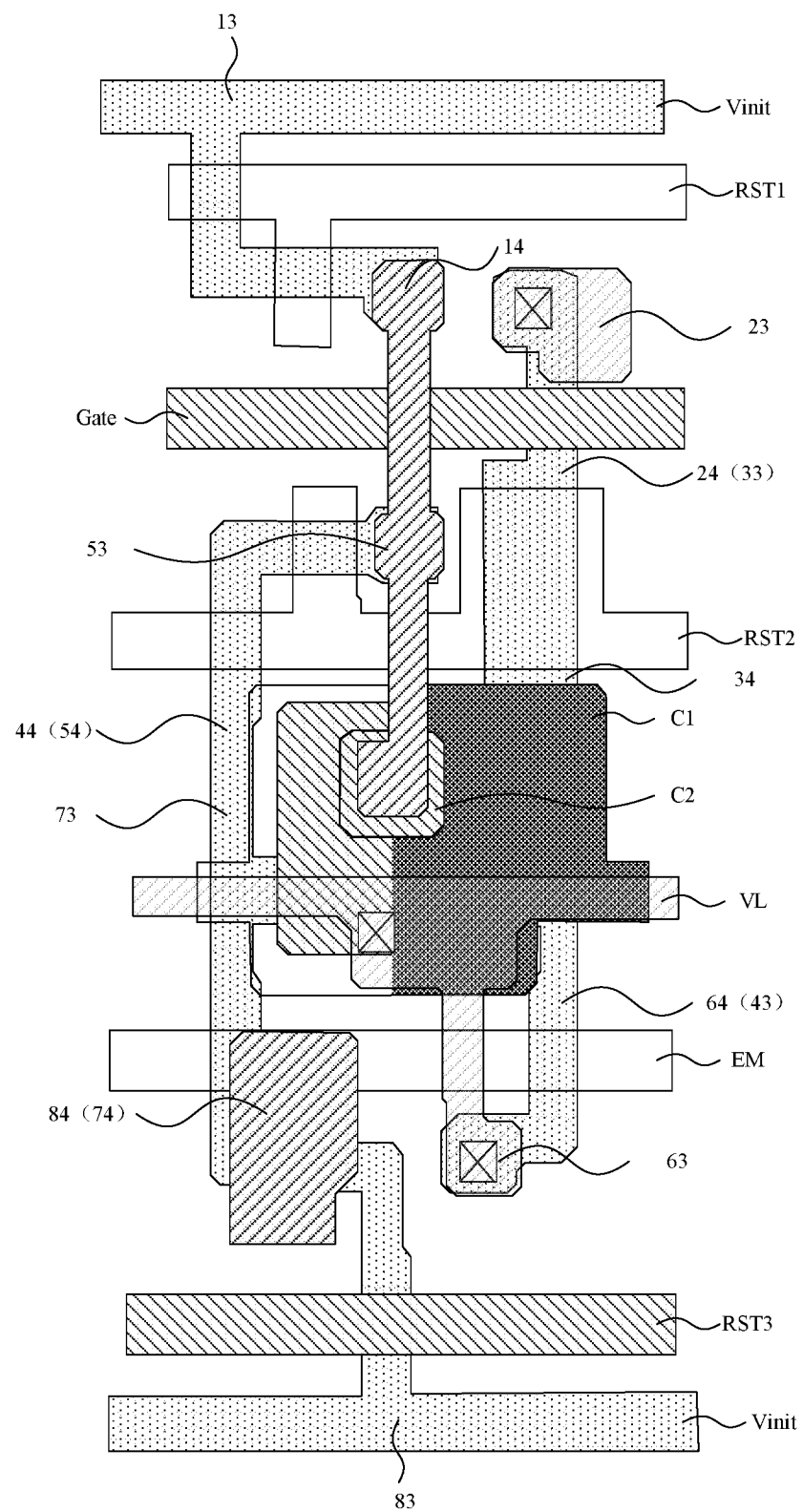
FIG. 16 is a schematic diagram of forming a third metal layer.

(5) Forming a third metal layer, including: depositing a third metal thin film on the substrate where the third insulating layer has been formed, and patterning the third metal thin film by a patterning process, to form a third metal layer. The third metal layer includes a power supply connecting line VL, a second electrode 14 of the first transistor, a first electrode 23 of the second transistor, a first electrode 53 of the fifth transistor, a first electrode 63 of the sixth transistor, a second electrode 74 of the seventh transistor, and a second electrode 84 of the eighth transistor, as shown in FIG. 16.

In an exemplary embodiment, the active layer is also reused as a first electrode 13 of the first transistor, a second electrode 24 of the second transistor, a first electrode 33 and a second electrode 34 of the third transistor, a first electrode 43 and a second electrode 44 of the fourth transistor, a second electrode 54 of the fifth transistor, a second electrode 64 of the sixth transistor, a first electrode 73 of the seventh transistor, and a first electrode 83 of the eighth transistor.

In an exemplary embodiment, the power supply connecting line VL extends along a first direction.

In an exemplary embodiment, the second electrode 14 of the first transistor and the first electrode 53 of the fifth transistor are connected into an integrated structure. The power supply connecting line VL and the first electrode 63 of the sixth transistor are connected into an integrated structure. The second electrode 74 of the seventh transistor and the second electrode 84 of the eighth transistor are connected into an integrated structure.

In an exemplary embodiment, the second electrode 14 of the first transistor is connected with the active layer 11 of the first transistor through the first via V1. The first electrode 23 of the second transistor is connected with the active layer 21 of the second transistor through the second via V2. The first electrode 53 of the fifth transistor is connected with the active layer 51 of the fifth transistor through the third via V3. The second electrode 74 of the seventh transistor is connected with the active layer 71 of the seventh transistor through the via V4. The first electrode 63 of the sixth transistor is connected with the active layer 61 of the sixth transistor through the via V5. The first electrode 53 of the fifth transistor is connected with the second plate C2 through the sixth via V6. The power supply connecting line VL is connected with the first plate C1 through the seventh via V7.

Figure 17:
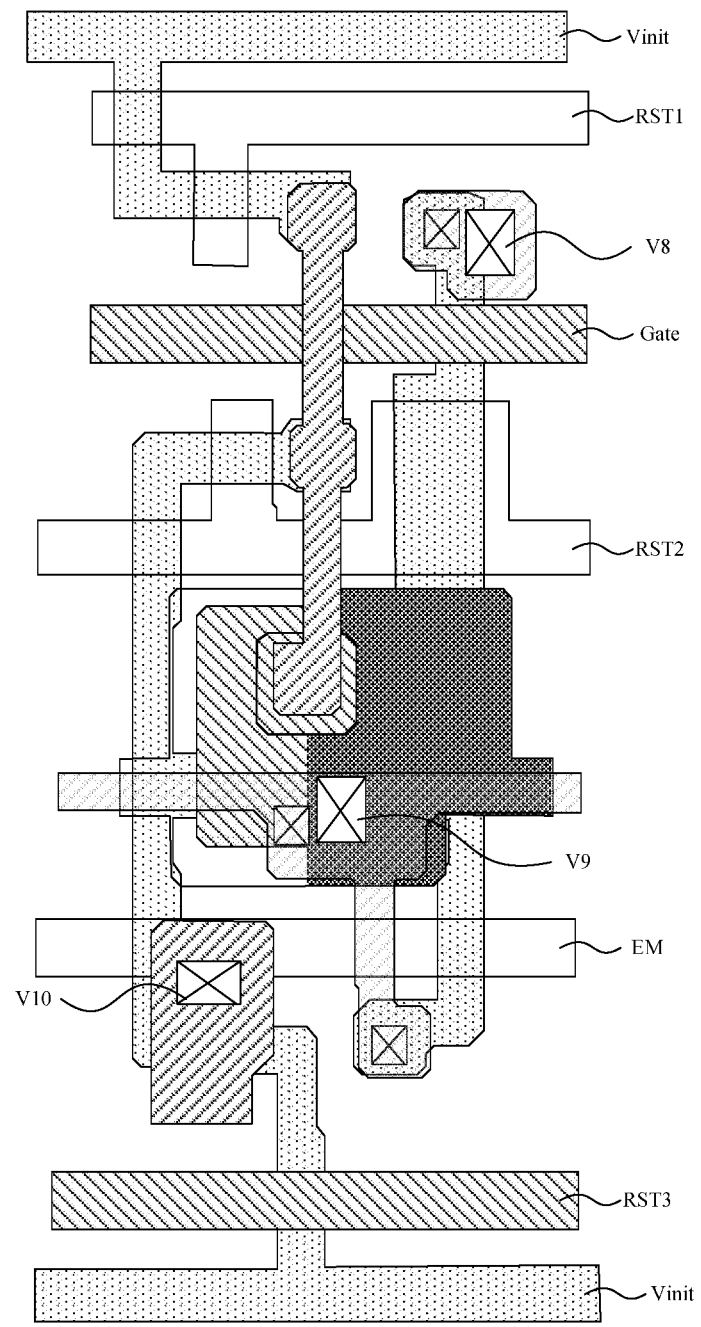
FIG. 17 is a schematic diagram of forming a first planarization layer.

(6) Forming a first planarization layer, including: depositing a fourth insulating thin film on the substrate where the third metal layer has been formed, and patterning the fourth insulating thin film by a patterning process, to form a fourth insulating layer; coating a planarization thin film on the substrate where the fourth insulating layer has been formed, and forming a first planarization layer by masking, exposing, and developing the planarization thin film. The fourth insulating layer and the first planarization layer are provided with an eighth via V8, a ninth via V9, and a tenth via V10, as shown in FIG. 17.

In an exemplary embodiment, the eighth via V8 exposes the first electrode 23 of the second transistor. The ninth via V9 exposes the power supply connecting line VL. The tenth via V10 exposes the second electrode 74 of the seventh transistor.

Figure 18:
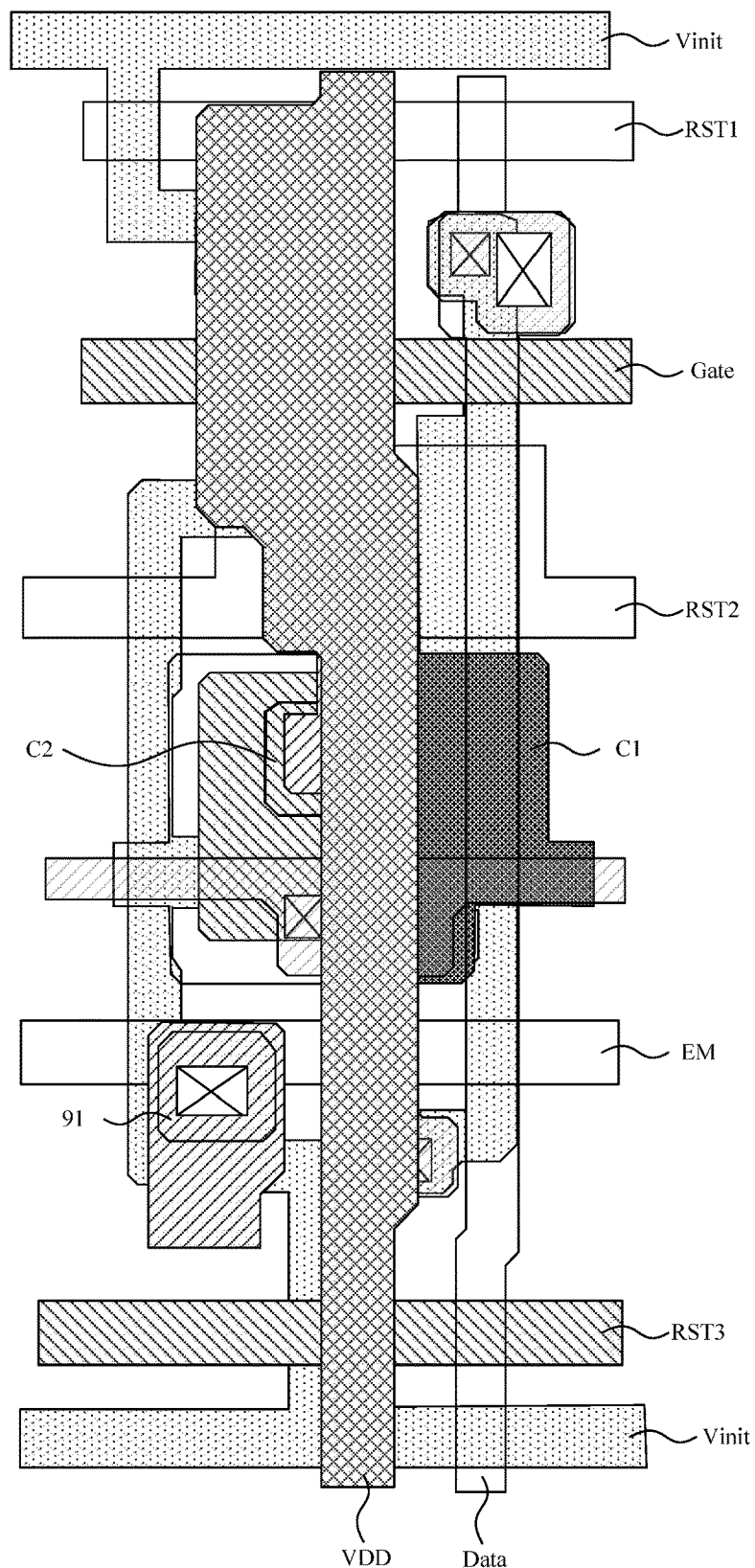
FIG. 18 is a schematic diagram of forming a fourth metal layer.

(7) Forming a fourth metal layer, including: depositing a fourth metal thin film on the substrate where the first planarization layer has been formed, and patterning the fourth metal thin film by a patterning process, to form a fourth metal layer. The fourth metal layer includes a first power supply line VDD, a data signal line Data and a pixel electrode 91, as shown in FIG. 18.

In an exemplary embodiment, the data signal line Data is connected with the first electrode 23 of the second transistor through the eighth via V8. The first power supply line VDD is connected with the power supply connecting line VL through the ninth via V9. The connecting electrode 91 is connected with the second electrode 74 of the seventh transistor through the tenth via V10.

Figure 19:
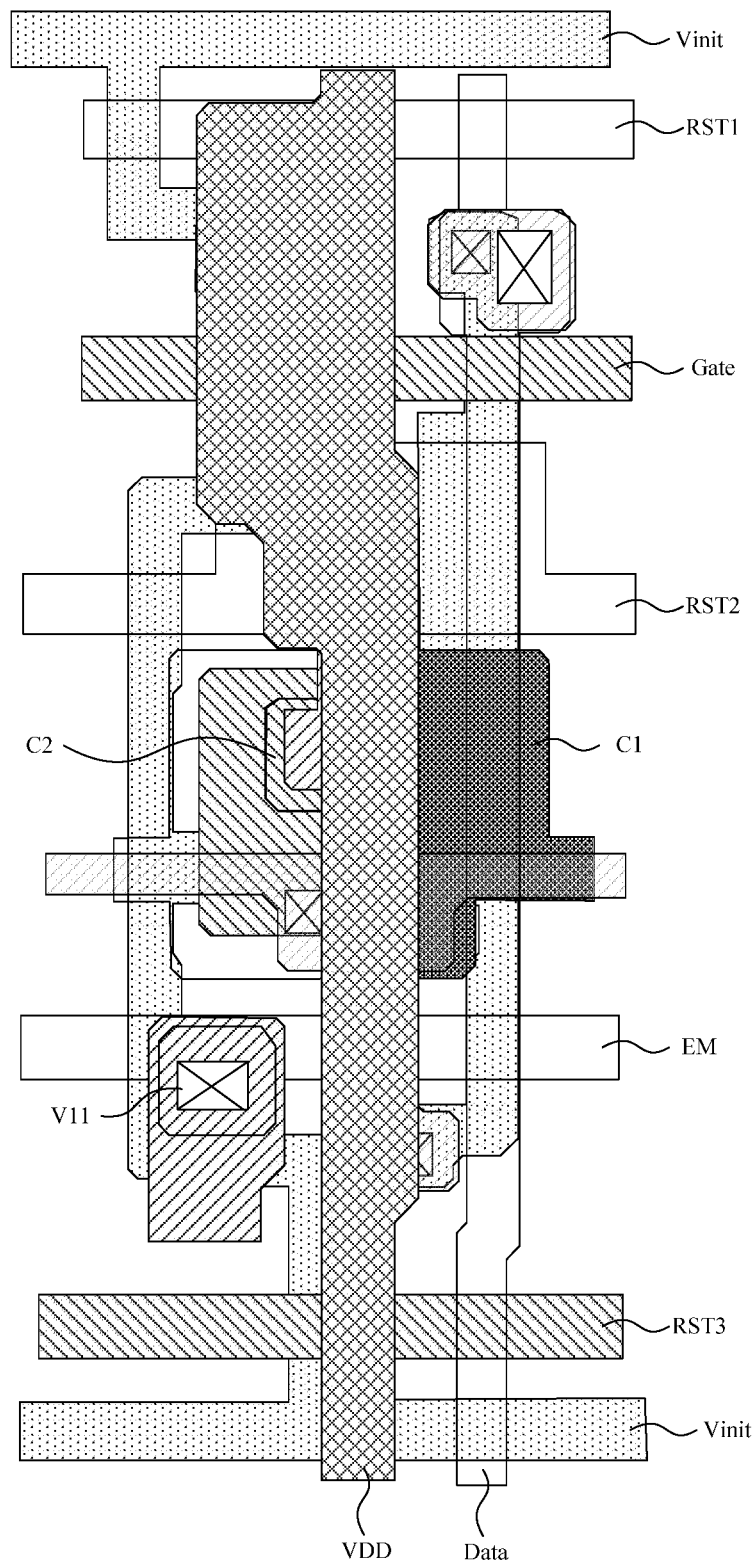
FIG. 19 is a schematic diagram of forming a second planarization layer.

(8) Forming a second planarization layer, including: coating a second planarization thin film on the substrate where the fourth metal layer has been formed, and forming a second planarization layer by masking, exposing, and developing the planarization thin film. The second planarization layer is provided with an eleventh via V11, as shown in FIG. 19.

In an exemplary embodiment, the eleventh via V11 exposes the connecting electrode 91. A light emitting element is connected with the connecting electrode 91 through the eleventh via V11.

(9) Forming a transparent conductive layer, including: depositing a first transparent conductive thin film on the substrate where the second planarization layer has been formed, and patterning the first transparent conductive thin film by a patterning process, to form a transparent conductive layer. The transparent conductive layer includes a first electrode formed in each light emitting element, and the first electrode is connected with the connecting electrode 91 through the eleventh via V11.

(10) Forming a pixel definition layer, including: coating a pixel definition thin film on the substrate where the transparent conductive layer has been formed, and forming a pixel definition layer by masking, exposure and development processes, wherein the pixel definition layer is formed in each light emitting element, and an opening region exposing the first electrode is formed in the pixel definition layer in each light emitting element.

(11) Forming an organic light emitting layer, including: forming an organic light emitting layer in the opening region of the formed pixel definition layer and on the pixel definition layer, wherein the organic light emitting layer is electrically connected with the first electrode.

(12) Forming a second electrode, including: coating a conductive thin film on the substrate where the organic light emitting layer has been formed, and patterning the conductive thin film by a patterning process, to form a second electrode. The second electrode covers the organic light emitting layer in each light emitting element. The second electrode is electrically connected with the organic light emitting layer.

(13) Forming an encapsulation layer on the substrate where the second electrode has been formed. The encapsulation layer includes a first encapsulation layer made of an inorganic material, a second encapsulation layer made of an organic material, and a third encapsulation layer made of an inorganic material. The first encapsulation layer is disposed on the second electrode, the second encapsulation layer is disposed on the first encapsulation layer, and the third encapsulation layer is disposed on the second encapsulation layer, to form an inorganic material/organic material/inorganic material stacked structure.

In an exemplary embodiment, the first metal layer, the second metal layer, the third metal layer and the fourth metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure such as Mo/Cu/Mo.

In an exemplary embodiment, the first insulating layer, the second insulating layer, the third insulating layer and the fourth insulating layer may be made of any one or more of silicon oxide (SiOx), silicon nitride (SiNx) and silicon oxynitride (SiON), and may be a single-layer, a multi-layer or a composite layer. The first insulating layer is referred to as a first gate insulating layer, the second insulating layer is referred to as a second gate insulating layer, the third insulating layer is referred to as an interlayer insulating layer, and the fourth insulating layer is referred as a passivation layer.

In an exemplary embodiment, the first planarization layer and the second planarization layer may be made of an organic material, and the transparent conductive thin film may be made of indium tin oxide (ITO) or indium zinc oxide (IZO).

In an exemplary embodiment, the pixel definition layer may be made of polyimide, acrylic or polyethylene terephthalate.

In an exemplary embodiment, the second electrode may be made of any one or more of magnesium (Mg), silver (Ag), aluminum (Al), copper (Cu) and lithium (Li), or an alloy made of any one or more of the above metals.

In an exemplary embodiment, the active layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or double layers, or multiple layers.

An embodiment of the present disclosure further provides a driving method of a display device, for driving the display device. The driving method of the display device provided by the embodiment of the present disclosure includes steps S1 to S3.

In step S1, a first reset sub-circuit provides a signal of an initial signal line to a first node under control of a first reset line;

In step S2, a second reset sub-circuit provides a signal of the initial signal line to a light emitting element under control of a third reset line, and a node control sub-circuit, under control of a scanning signal line, a second reset line and the first node, provides a signal of a data signal line to a second node, and compensates the first node through the second node and a third node until the voltage of the first node meets a threshold condition;

In step S3, a light emitting control sub-circuit, under control of a light emitting control line, provides a signal of a first power supply line to the second node, and provides a signal of the third node to the light emitting element; and the node control sub-circuit provides a signal of the second node to the third node under control of the first node.

The display device is a display device provided by any one of the previous embodiments, and has similar implementation principle and implementation effects, which will not be repeated here.

The accompanying drawings of the present disclosure only involve the structures involved in the embodiments of the present disclosure, and the other structures may refer to conventional designs.

For the sake of clarity, in the accompanying drawings used to describe the embodiments of the present disclosure, the thickness and dimension of a layer or a micro structure is enlarged. It is to be understood that when an element such as a layer, film, region or substrate is described as being "on" or "under" another element, it can be "directly" located "on" or "under" the other element, or there may be an intermediate element.

Although the implementations disclosed in the present disclosure are as above, the described contents are only implementations for facilitating understanding the present disclosure but not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display device, comprising: light emitting elements arranged in a matrix, pixel circuits arranged in a matrix, a scanning signal line, a data signal line, an initial signal line, a light emitting control line, a first power supply line, a first reset line, a second reset line, and a third reset line;

wherein:

the pixel circuits are in one-to-one correspondence with the light emitting elements; a pixel circuit is configured to drive a corresponding light emitting element to emit light, and the pixel circuit comprises a first reset sub-circuit, a node control sub-circuit, a light emitting control sub-circuit and a second reset sub-circuit;

the first reset sub-circuit is connected respectively with the first reset line, the initial signal line, and a first node, and is configured to provide a signal of the initial signal line to the first node under control of the first reset line;

the node control sub-circuit is connected respectively with the scanning signal line, the second reset line, the data signal line, the first node, a second node, a third node and the first power supply line, and is configured to, under control of the scanning signal line, the second reset line and the first node, provide a signal of the data signal line to the second node, and compensate the first node through the second node and the third node until a voltage of the first node meets a threshold condition, and to provide a signal of the second node to the third node under control of the first node;

the light emitting control sub-circuit is connected respectively with the light emitting control line, the first power supply line, the second node, the third node and a light emitting element, and is configured to, under control of the light emitting control line, provide a signal of the first power supply line to the second node and provide a signal of the third node to the light emitting element;

the second reset sub-circuit is connected respectively with the third reset line, the initial signal line and the light emitting element, and is configured to provide a signal of the initial signal line to the light emitting element under control of the third reset line;

a third reset line connected with a pixel circuit located in an $i^{th}$ row is electrically connected with a first reset line connected with a pixel circuit located in an $(i+1)^{th}$ row, $1 \le i < M$, where M is a total number of rows of the pixel circuits;

the display device comprises: a substrate and a driving structure layer and a light emitting structure layer sequentially disposed on the substrate;

the driving structure layer comprises the pixel circuits, the scanning signal line, the data signal line, the initial signal line, the light emitting control line, the first power supply line, the first reset line, the second reset line and the third reset line, and the light emitting structure layer comprises the light emitting elements;

the scanning signal line, the initial signal line, the light emitting control line, the first reset line, the second reset line, and the third reset line extend along a first direction, the data signal line and the first power supply line extend along a second direction; and the first direction intersects with the second direction.

2. The device according to claim 1, wherein each pixel circuit comprises a storage capacitor comprising a first plate and a second plate; the first plate is connected with the first power supply line, and the second plate is connected with the first node;

an orthographic projection of the first plate on the substrate is partially overlapped with an orthographic projection of the second plate on the substrate; the first plate is provided with a via, and the via of the first plate exposes the second plate;

the scanning signal line, the first reset line and the second reset line are located at one side of the second plate, and the light emitting control line and the third reset line are located at one side of the second plate away from the first reset line;

the first reset line is located at one side of the scanning signal line away from the second plate, the second reset line is located at one side of the scanning signal line close to the second plate, and the third reset line is located at one side of the light emitting control line away from the second plate;

the initial signal line comprises a first initial signal line and a second initial signal line; the first initial signal line and the first reset line are located at a same side of the second plate, and the first initial signal line is located at one side of the first reset line away from the second plate; the second initial signal line and the third reset line are located at a same side of the second plate, and the second initial signal line is located at one side of the third reset line away from the second plate.

3. The device according to claim 2, wherein the driving structure layer further comprises: a power supply connecting line and a connecting electrode;

the power supply connecting line is disposed in a different layer from the first power supply line and is connected with the first power supply line, and the first plate is connected with the first power supply line by the power supply connecting line;

an orthographic projection of the power supply connecting line on the substrate is at least partially overlapped with the orthographic projection of the first plate on the substrate and at least partially overlapped with an orthographic projection of the first power supply line on the substrate;

the connecting electrode is configured to connect the pixel circuit with the light emitting element.

4. The device according to claim 1, wherein the node control sub-circuit comprises: a writing sub-circuit, a driving sub-circuit, a compensation sub-circuit, and an energy storage sub-circuit;

the writing sub-circuit is connected respectively with the scanning signal line, the second reset line, the data signal line and the second node, and is configured to provide a signal of the data signal line to the second node under control of the scanning signal line and the second reset line, or to discharge to the second node;

the driving sub-circuit is connected respectively with the first node, the second node, and the third node, and is configured to provide a signal of the second node to the third node under control of the first node;

the compensation sub-circuit is connected respectively with the first node, the second reset line and the third node, and is configured to provide a potential of the third node to the first node under control of the second reset line to compensate the first node until the voltage of the first node meets the threshold condition;

the energy storage sub-circuit is connected respectively with the first power supply line and the first node, and is configured to store a voltage difference between the first power supply line and the first node.

5. The device according to claim 1, wherein the first reset sub-circuit comprises a first transistor;

a control electrode of the first transistor is connected with the first reset line, a first electrode of the first transistor is connected with the initial signal line, and a second electrode of the first transistor is connected with the first node.

6. The device according to claim 4, wherein the writing sub-circuit comprises a second transistor and a third transistor;

a control electrode of the second transistor is connected with the scanning signal line, a first electrode of the second transistor is connected with the data signal line, and a second electrode of the second transistor is connected with a first electrode of the third transistor;

a control electrode of the third transistor is connected with the second reset line, and a second electrode of the third transistor is connected with the second node;

a length of a conductive channel of the third transistor is greater than a threshold length, and a width of the conductive channel of the third transistor is greater than a threshold width.

7. The device according to claim 4, wherein the driver sub-circuit comprises a fourth transistor, and the fourth transistor is a driving transistor; the energy storage sub-circuit comprises a storage capacitor;

a control electrode of the fourth transistor is connected with the first node, a first electrode of the fourth transistor is connected with the second node, and a second electrode of the fourth transistor is connected with the third node;

a first terminal of the storage capacitor is connected with the first power supply line, and a second terminal of the storage capacitor is connected with the first node.

8. The device according to claim 4, wherein the compensation sub-circuit comprises a fifth transistor;

a control electrode of the fifth transistor is connected with the second reset line, a first electrode of the fifth transistor is connected with the first node, and a second electrode of the fifth transistor is connected with the third node.

9. The device according to claim 1, wherein the light emitting control sub-circuit comprises a sixth transistor and a seventh transistor;

a control electrode of the sixth transistor is connected with the light emitting control line, a first electrode of the sixth transistor is connected with the first power supply line, and a second electrode of the sixth transistor is connected with the second node;

a control electrode of the seventh transistor is connected with the light emitting control line, a first electrode of the seventh transistor is connected with the third node, and a second electrode of the seventh transistor is connected with the light emitting element.

10. The device according to claim 1, wherein the second reset sub-circuit comprises an eighth transistor;
a control electrode of the eighth transistor is connected with the third reset line, a first electrode of the eighth transistor is connected with the initial signal line, and a second electrode of the eighth transistor is connected with the light emitting element.

11. The device according to claim 1, wherein the first reset sub-circuit comprises a first transistor; the node control sub-circuit comprises a second transistor, a third transistor, a fourth transistor, a fifth transistor and a storage capacitor, wherein the fourth transistor is a driving transistor; the light emitting control sub-circuit comprises a sixth transistor and a seventh transistor; and the second reset sub-circuit comprises an eighth transistor;
a control electrode of the first transistor is connected with the first reset line, a first electrode of the first transistor is connected with the initial signal line, and a second electrode of the first transistor is connected with the first node;
a control electrode of the second transistor is connected with the scanning signal line, a first electrode of the second transistor is connected with the data signal line, and a second electrode of the second transistor is connected with a first electrode of the third transistor;
a control electrode of the third transistor is connected with the second reset line, and a second electrode of the third transistor is connected with the second node;
a control electrode of the fourth transistor is connected with the first node, a first electrode of the fourth transistor is connected with the second node, and a second electrode of the fourth transistor is connected with the third node;
a control electrode of the fifth transistor is connected with the second reset line, a first electrode of the fifth transistor is connected with the first node, and a second electrode of the fifth transistor is connected with the third node;
a first terminal of the storage capacitor is connected with the first power supply line, and a second terminal of the storage capacitor is connected with the first node;
a control electrode of the sixth transistor is connected with the light emitting control line, a first electrode of the sixth transistor is connected with the first power supply line, and a second electrode of the sixth transistor is connected with the second node;
a control electrode of the seventh transistor is connected with the light emitting control line, a first electrode of the seventh transistor is connected with the third node, and a second electrode of the seventh transistor is connected with the light emitting element;
a control electrode of the eighth transistor is connected with the third reset line, a first electrode of the eighth transistor is connected with the initial signal line, and a second electrode of the eighth transistor is connected with the light emitting element.

12. The device according to claim 11, wherein the light emitting element comprises an organic light emitting diode;
an anode of the organic light emitting diode is connected respectively with the second electrode of the seventh transistor and the second electrode of the eighth transistor, and a cathode of the organic light emitting diode is connected with a second power supply line.

13. The device according to claim 7, wherein the threshold condition is that the voltage of the first node is equal to a difference between a voltage of the signal of the data signal line and an absolute value of a threshold voltage of the fourth transistor.

14. The device according to claim 1, wherein the scanning signal line and the third reset line are electrically connected.

15. The device according to claim 11, wherein, for the first transistor to the eighth transistor, each transistor comprises an active layer, a control electrode, a first electrode, and a second electrode;
the display device comprises a substrate and a driving structure layer disposed on the substrate, wherein the driving structure layer comprises an active layer, a first insulating layer, a first metal layer, a second insulating layer, a second metal layer, a third insulating layer, a third metal layer, a fourth insulating layer, a first planarization layer, a fourth metal layer and a second planarization layer that are sequentially disposed along a direction perpendicular to the substrate;
the active layer comprises the initial signal line and the active layers of all transistors; the first metal layer comprises the scanning signal line, the first reset line, the second reset line, a second plate of a storage capacitor, the light emitting control line, the third reset line and the control electrodes of all transistors; the second metal layer comprises a first plate of the storage capacitor; the third metal layer comprises a power supply connecting line and a first electrode or a second electrode of a part of the transistors; the fourth metal layer comprises the first power supply line, the data signal line and a pixel electrode.

16. The device according to claim 15, wherein the control electrode of the first transistor comprises a first sub-control electrode and a second sub-control electrode disposed in a same layer.

17. The device according to claim 15, wherein the first insulating layer, the second insulating layer, and the third insulating layer are provided with a first via, a second via, a third via, a fourth via, and a fifth via; the second insulating layer and the third insulating layer are provided with a sixth via; the third insulating layer is provided with a seventh via; the fourth insulating layer and the first planarization layer are provided with an eighth via, a ninth via and a tenth via; the second planarization layer comprises an eleventh via;
the first via exposes the active layer of the first transistor, and the second electrode of the first transistor is connected with the active layer of the first transistor through the first via; the second via exposes the active layer of the second transistor, and the first electrode of the second transistor is connected with the active layer of the second transistor through the second via; the third via exposes the active layer of the fifth transistor, and the first electrode of the fifth transistor is connected with the active layer of the fifth transistor through the third via; the fourth via exposes the active layer of the seventh transistor, and the second electrode of the seventh transistor is connected with the active layer of the seventh transistor through the fourth via; the fifth via exposes the active layer of the sixth transistor, and the first electrode of the sixth transistor is connected with the active layer of the sixth transistor through the fifth via; the sixth via exposes the second plate, and the first electrode of the fifth transistor is connected with the second plate through the sixth via; the seventh via exposes the first plate, and the power supply connecting line is connected with the first plate through the seventh via; the eighth via exposes the first electrode of the second transistor, and the data signal line is connected with the first electrode of the second transistor through the eighth via; the ninth via exposes the power supply connecting line, and the first power supply line is connected with the power supply connecting line through the ninth via; the tenth via exposes the second electrode of the seventh transistor, and a connecting electrode is connected with the second electrode of the seventh transistor through the tenth via; the eleventh via exposes the connecting electrode, and the light emitting element is connected with the connecting electrode through the eleventh via.

18. The device according to claim 1, wherein the light emitting element comprises a first electrode, a second electrode, and an organic light emitting layer; the first electrode is located on one side of the organic light emitting layer close to the substrate, and the second electrode is located on one side of the organic light emitting layer away from the substrate;

the display device comprises a light emitting structure layer, and the light emitting structure layer comprises a pixel definition layer, a transparent conductive layer, an organic material layer and a conductive layer, wherein the transparent conductive layer comprises the first electrode, the organic material layer comprises the organic light emitting layer, and the conductive layer comprises the second electrode.

19. A driving method of a display device, for driving the display device according to claim 1, the method comprising:

providing, by the first reset sub-circuit, a signal of the initial signal line to the first node under control of the first reset line;

providing, by the second reset sub-circuit, a signal of the initial signal line to the light emitting element under control of the third reset line, and providing, by the node control sub-circuit, a signal of the data signal line to the second node, and compensating the first node through the second node and the third node until the voltage of the first node meets the threshold condition, under control of the scanning signal line, the second reset line and the first node; and providing, by the light emitting control sub-circuit, a signal of the first power supply line to the second node, and a signal of the third node to the light emitting element, under control of the light emitting control line; and providing, by the node control sub-circuit, a signal of the second node to the third node under control of the first node.

* * * * *